(12) United States Patent
Perthold et al.

(10) Patent No.: US 8,670,506 B2
(45) Date of Patent: Mar. 11, 2014

(54) APPARATUS AND METHOD FOR PROVIDING A REDUCED REPRESENTATION BASED ON A TIME-DOMAIN RF SIGNAL

(75) Inventors: Rainer Perthold, Weisendorf (DE); Dieter Weninger, Markt Erlbach (DE)

(73) Assignee: Innovationszentrum fuer Telekommunikationstechnik GmbH IZT, Erlangen (DE)

( * ) Notice: Subject to any disclaimer, the term of this patent is extended or adjusted under 35 U.S.C. 154(b) by 0 days.

(21) Appl. No.: 13/370,724

(22) Filed: Feb. 10, 2012

(65) Prior Publication Data

US 2012/0201325 A1 Aug. 9, 2012

Related U.S. Application Data

(63) Continuation of application No. PCT/EP2009/005923, filed on Aug. 14, 2009.

(51) Int. Cl.
*H04L 27/06* (2006.01)

(52) U.S. Cl.
USPC ........... 375/340; 375/240; 375/342; 375/346; 375/347; 375/350; 375/351; 342/192; 342/194; 342/25 R

(58) Field of Classification Search
CPC ..... G01S 13/90; G01S 7/003; G01S 13/3011; G01S 2007/2883; H03M 7/30; H03M 7/4006; G10L 19/032; G10L 19/0204; G06F 17/141; G06F 17/142; G06F 17/147; H04L 1/06; H04L 25/022; H04L 27/265; H04L 27/2649; H04L 7/0087
USPC ......... 375/240, 340, 342, 346, 347, 350, 351; 342/192, 194, 25 R See application file for complete search history.

(56) References Cited

U.S. PATENT DOCUMENTS

| | | | | |
|---|---|---|---|---|
| 3,940,762 A * | 2/1976 | Ethington et al. | | 342/90 |
| 4,801,939 A * | 1/1989 | Jones | | 342/25 A |
| 5,835,034 A * | 11/1998 | Seroussi et al. | | 341/65 |
| 5,982,935 A * | 11/1999 | Arbel | | 382/233 |
| 6,073,154 A * | 6/2000 | Dick | | 708/401 |
| 7,009,533 B1 * | 3/2006 | Wegener | | 341/76 |
| 7,062,445 B2 * | 6/2006 | Kadatch | | 704/500 |
| 7,084,805 B2 * | 8/2006 | Cirillo et al. | | 342/25 R |
| 7,876,257 B2 * | 1/2011 | Vetro et al. | | 342/25 F |
| 2002/0143556 A1 * | 10/2002 | Kadatch | | 704/500 |
| 2004/0017307 A1 * | 1/2004 | Cirillo et al. | | 342/25 |
| 2009/0267825 A1 * | 10/2009 | Vetro et al. | | 342/25 R |
| 2010/0081387 A1 * | 4/2010 | Shi et al. | | 455/62 |

OTHER PUBLICATIONS

Algra T et al: "Advanced on-board SAR Data Compressor "Geoscience and Remote Sensing Symposium, 2006, IGARSS 2006, IEEE International Conference on, IEEE, PI LNKD-DOI:1 0.11 09/IGARSS.2006.907, Jul. 1, 2006, pp. 3637-3540, XP031179785 1SBN: 978-0-7803-9510-7.

* cited by examiner

*Primary Examiner* — Sophia Vlahos
(74) *Attorney, Agent, or Firm* — Michael A. Glenn; Perkins Coie LLP

(57) ABSTRACT

An apparatus according to an embodiment of the present invention for providing a reduced representation in a frequency-domain, based on a time-based RF signal, has a time-frequency converter adapted to transform the time-domain RF signal to obtain a frequency-domain representation based on the time-domain signal and an entropy encoder adapted to obtain the reduced representation based on the frequency-domain representation by entropy encoding.

11 Claims, 16 Drawing Sheets

|  | start (MHz) | stop (MHz) | bandwidth | ignore |
|---|---|---|---|---|
| 1 | 88,100000 | 107,500000 | 50 kHz | ☐ |
| 2 | 100,000000 |  | 100 kHz | ☐ |
| 3 | 90,000000 | 91,000000 |  | ☑ |
| 4 |  |  |  | ☐ |
| 5 |  |  |  | ☐ |
| 6 |  |  |  | ☐ |
| 7 |  |  |  | ☐ |
| 8 |  |  |  | ☐ |
| 9 |  |  |  | ☐ |
| 10 |  |  |  | ☐ |
| 11 |  |  |  | ☐ |
| 12 |  |  |  | ☐ |
| 13 |  |  |  | ☐ |
| 14 |  |  |  | ☐ |
| 15 |  |  |  | ☐ |
| 16 |  |  |  | ☐ |
| 17 |  |  |  | ☐ |
| 18 |  |  |  | ☐ |
| 19 |  |  |  | ☐ |
| 20 |  |  |  | ☐ |
| 21 |  |  |  | ☐ |
| 22 |  |  |  | ☐ |
| 23 |  |  |  | ☐ |
| 24 |  |  |  | ☐ |
| 25 |  |  |  | ☐ |
| 26 |  |  |  | ☐ |
| 27 |  |  |  | ☐ |
| 28 |  |  |  | ☐ |
| 29 |  |  |  | ☐ |
| 30 |  |  |  | ☐ |
| 31 |  |  |  | ☐ |
| 32 |  |  |  | ☐ |
| 33 |  |  |  | ☐ |
| 34 |  |  |  | ☐ |
| 35 |  |  |  | ☐ |
| 36 |  |  |  | ☐ |
| 37 |  |  |  | ☐ |
| 38 |  |  |  | ☐ |
| 39 |  |  |  | ☐ |
| 40 |  |  |  | ☐ |

FIGURE 15A

|    | center freq. MHz | bandwidth kHz | occupation % | max level dBm | average level | rel. Precision % |
|----|------------------|---------------|--------------|---------------|---------------|------------------|
| 1  | 88,150000        | 50,000        | 10,7         | -80,1         | -88,5         | 27,9             |
| 2  | 88,200000        | 50,000        | 100,0        | -74,3         | -75,2         | 7,7              |
| 3  | 88,250000        | 50,000        | 17,6         | -79,6         | -87,9         | 20,7             |
| 4  | 88,500000        | 50,000        | 100,0        | -78,8         | -79,2         | 7,7              |
| 5  | 88,800000        | 50,000        | 95,0         | -82,8         | -83,2         | 9,4              |
| 6  | 88,850000        | 50,000        | 64,0         | -74,8         | -81,1         | 12,2             |
| 7  | 88,900000        | 50,000        | 100,0        | -66,9         | -68,9         | 7,7              |
| 8  | 88,950000        | 50,000        | 58,1         | -75,8         | -81,8         | 12,1             |
| 9  | 89,100000        | 50,000        | 100,0        | -80,1         | -80,4         | 7,7              |
| 10 | 89,400000        | 50,000        | 100,0        | -81,0         | -81,4         | 7,7              |
| 11 | 89,700000        | 50,000        | 86,6         | -77,4         | -80,0         | 10,4             |
| 12 | 89,750000        | 50,000        | 100,0        | -76,1         | -77,5         | 7,7              |
| 13 | 91,050000        | 50,000        | 13,1         | -72,2         | -81,8         | 26,7             |
| 14 | 91,350000        | 50,000        | 13,6         | -75,9         | -81,6         | 22,3             |
| 15 | 91,400000        | 50,000        | 100,0        | -67,8         | -69,3         | 7,7              |
| 16 | 91,450000        | 50,000        | 18,3         | -74,7         | -80,9         | 21,5             |
| 17 | 92,250000        | 50,000        | 27,0         | -68,1         | -78,1         | 19,4             |
| 18 | 92,300000        | 50,000        | 100,0        | -61,7         | -63,5         | 7,7              |
| 19 | 92,350000        | 50,000        | 42,1         | -67,7         | -76,9         | 13,9             |
| 20 | 92,850000        | 50,000        | 87,3         | -69,5         | -75,3         | 12,6             |
| 21 | 92,900000        | 50,000        | 100,0        | -61,5         | -63,2         | 7,7              |
| 22 | 92,950000        | 50,000        | 88,7         | -70,0         | -76,1         | 12,0             |
| 23 | 93,700000        | 50,000        | 82,5         | -81,5         | -82,3         | 29,1             |
| 24 | 94,450000        | 50,000        | 0,2          | -84,9         | -91,2         | --               |
| 25 | 94,500000        | 50,000        | 59,7         | -77,1         | -83,4         | 23,7             |
| 26 | 94,550000        | 50,000        | 0,2          | -85,2         | -92,4         | --               |
| 27 | 95,500000        | 50,000        | 83,1         | -81,5         | -83,4         | 16,6             |
| 28 | 95,750000        | 50,000        | 100,0        | -83,4         | -87,8         | 90,6             |
| 29 | 95,800000        | 50,000        | 0,9          | -71,8         | -75,2         | 7,7              |
| 30 | 95,850000        | 50,000        | 1,2          | -83,6         | -86,1         | 76,6             |
| 31 | 96,000000        | 50,000        | 2,0          | -83,5         | -85,3         | 67,9             |
| 32 | 96,350000        | 50,000        | 18,3         | -78,3         | -86,1         | 19,2             |

FIGURE 15B

APPARATUS AND METHOD FOR PROVIDING A REDUCED REPRESENTATION BASED ON A TIME-DOMAIN RF SIGNAL

CROSS-REFERENCE TO RELATED APPLICATIONS

This application is a continuation of copending International Application No. PCT/EP2009/005923, filed Aug. 14, 2009, which is incorporated herein by reference in its entirety.

BACKGROUND OF THE INVENTION

Embodiments according to the present invention relate to apparatuses and methods for providing a reduced representation based on a time-domain RF signal (RF=radio frequency) which may be used in a broad range of applications, for instance, when analyzing radio or cable-bound transmissions. It may, furthermore, be used when transmitting digitized RF signals between components of a more complex system.

In many fields of modern technology, a limiting factor is the available bandwidth for transporting data, signals; and other pieces of information between components, systems, or other circuits. In many cases, the maximum data throughput of such a link and the capacity of storage systems will limit a maximum available RF bandwidth, which can be processed by such a system.

In state of the art receiver systems, the digitized data are typically transmitted over a data link using a complex-valued I/Q data with a fixed resolution of, for instance, 16, 24, or 32 bits for both the imaginary and the real parts of the samples. When using complex or complex-valued I/Q data for transportation of data, a signal component being in-phase with a reference oscillation and a component with a phase-shift of 90° will be transmitted, which are referred to as in-phase (=I) data and quadrature (=Q) data.

This method is, however, rather inefficient. First of all, the signals to be transmitted usually comprise a significant amount of redundant information. An extreme example is a spectrum of a continuous wave (CW) signal, where most frequency bins in a frequency representation contain very little, or ideally, no energy, while only one frequency bin comprises a contribution with a higher value. The energy in the bins which only contains very little energy is typically caused by the receiver noise floor and other noise sources. Nevertheless, all bins are transmitted by transmitting the time-domain signal with the same word length, e.g. 32-bits for each of the two components.

SUMMARY

According to an embodiment, an apparatus for providing a reduced representation in the frequency domain based on a time-domain RF signal, may have a time-frequency converter adapted to transform the time-domain RF signal to acquire the frequency-domain representation based on the time-domain signal; an entropy encoder adapted to acquire the reduced representation by entropy encoding a signal representing the frequency-domain representation or derived from the frequency-domain representation; and an eliminator adapted to remove at least one portion of the frequency-domain representation, wherein a signal property of the portion of the frequency-domain representation fulfils a predetermined condition.

According to another embodiment, a method for providing a reduced representation in a frequency domain based on a time-domain RF signal, may have the steps of time-frequency converting the time-domain RF signal to acquire a frequency-domain representation based on the time-domain RF signal; removing at least one portion of the frequency-domain representation, wherein a signal property of the portion of the frequency-domain representation fulfils a predetermined condition; and acquiring the reduced representation by entropy encoding a signal representing the frequency-domain representation or derived from the frequency-domain representation.

According to another embodiment, a computer program may perform, when running on a computer or processor, a method for providing a reduced representation in a frequency domain based on a time-domain RF signal, which may have the steps of time-frequency converting the time-domain RF signal to acquire a frequency-domain representation based on the time-domain RF signal; removing at least one portion of the frequency-domain representation, wherein a signal property of the portion of the frequency-domain representation fulfils a predetermined condition; and acquiring the reduced representation by entropy encoding a signal representing the frequency-domain representation or derived from the frequency-domain representation.

Embodiments according to the present invention are based on the finding that a reduced representation based on a time-domain RF signal may efficiently be provided by converting the time-domain RF signal into a frequency domain to obtain a frequency domain representation based on the time-domain signal and to obtain the reduced representation based on the frequency-domain representation by entropy encoding. Such an apparatus according to an embodiment of the present invention may therefore have a time-frequency converter adapted to transform the time-domain RF signal to obtain a frequency-domain representation based on the time-domain signal and an entropy encoder adapted to encode the reduced representation based on the frequency-domain representation by entropy encoding.

Further embodiments according to the present invention may comprise a time-frequency converter which is further adapted to weight the time-domain RF signal or the frequency-domain representation by weighting function, which may for instance by used to suppress the frequency components which are of little or no interest for the application in mind.

Alternatively, embodiments according to the present invention may further comprise an eliminator adapted to remove at least one portion of the frequency-domain representation, when a signal property of the portion of a. frequency-domain representation fulfills a predefined condition. This may, for instance, be implemented by setting the contributions of the respective portion to a predefined value (e.g. zero), or by neglecting, not providing or by removing these portions of the frequency-domain representation.

In further embodiments according to the present invention, additional components may be used to adaptively influence the degree of reduction. For instance, an embodiment according to the present invention may comprise a control circuit adapted to influence other components of the apparatus, such as the time/frequency converter, the entropy encoder, or one of the other optional components. The control circuit may for instance be adapted to influence the word size to the size of the underlying alphabet used by the entropy encoder. Further examples of the control circuit will be outlined below.

BRIEF DESCRIPTION OF THE DRAWINGS

Embodiments according to the present invention will be described hereinafter making reference to the appended drawings.

FIGS. 15a,b show an example of a configuration of a spectral occupancy measurement and corresponding measurement results.

DETAILED DESCRIPTION OF THE INVENTION

Figure 1:
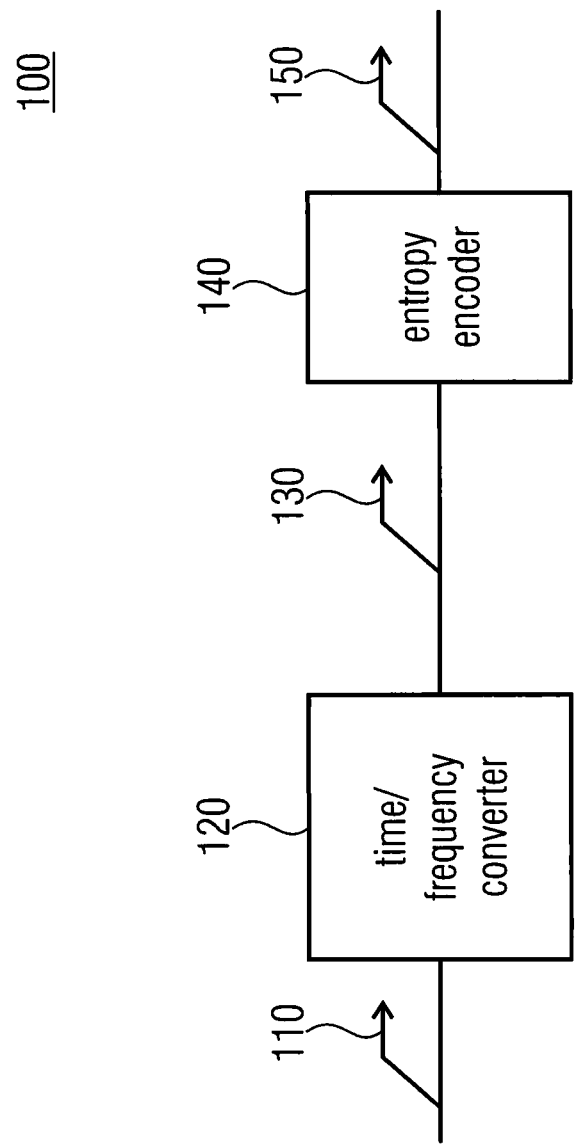
FIG. 1 shows a block diagram of an embodiment according to the present invention.
Figure 2A:
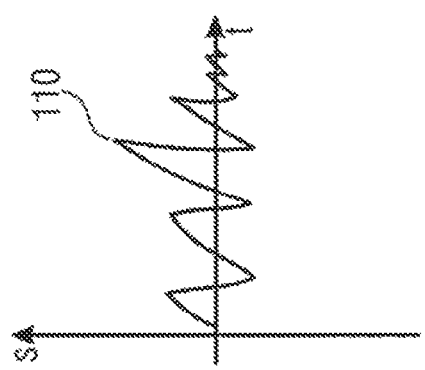
FIG. 2 illustrates an operational principle of an embodiment according to the present invention.
Figure 2B:
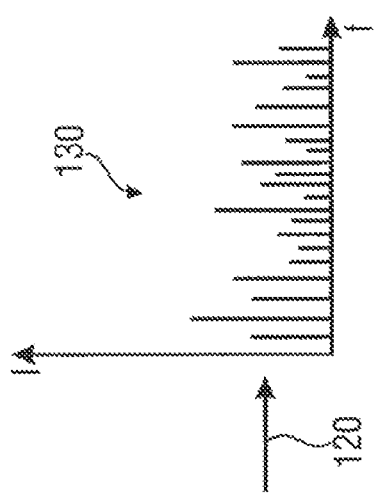
Figure 2C:
Figure 2C:
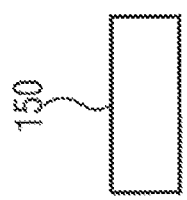

In the following, embodiments according to the present invention will be described with respect to FIGS. 1-15. However, before describing the different embodiments according to the present invention in more detail, it should be noted that in the present description objects, components and signals will be referenced with the same or similar reference signs when the respective elements are functionally or structurally comparable. Furthermore, objects, elements and signals referenced by the same or similar reference signs may, for instance, due to their comparable function or structure, be identical, having comparable or equal quantitative parameters (e.g. component-specific parameters such as bit resolution, etc.), or differently implemented. In other words, it is to be noted that the same or similarly acting functional elements have the same reference numerals in the different embodiments, and hence the description of these functional elements is mutually interchangeable in the various embodiments illustrated in the following.

Moreover, in the following description summarizing reference signs may be used to describe elements, objects, or signals, appearing more than once in an implementation or an embodiment, when the respective part of the description applies to all or at least a subset of the respective elements, objects, or signals. If a property of such an element, object, or signal, a feature or its integration into a system or apparatus is discussed, individual reference signs will be used to address the specific component.

FIG. 1 shows a block diagram of an apparatus 100 for providing a reduced representation in a frequency domain based on a time-domain radio frequency signal 110. The radio frequency signal 110 or RF signal 110 is provided to a time/frequency converter 120, which is adapted to transform the time-domain radio frequency signal 110 to obtain a frequency-domain representation 130, based on the time-domain signal 110. An output of the time/frequency converter 120 is coupled to an entropy encoder 140, which in turn is adapted to obtain a reduced representation 150 based on the frequency-domain representation 130 by entropy encoding the signals provided.

It should be noted that in the present description the terms "representation", "signal", and "data" may be used synonymously, depending on the implementation. For instance, in the case of a digitally implemented apparatus 100, the respective signals, representations, or data, may be exchanged between the different functional groups of components by means of a storage system, such as a random access memory (RAM) or other storage locations. In the case of a discrete implementation comprising individual integrated circuits, discrete, electrical and electronical devices, or a combination thereof, the signals, data, or representations to be transferred from one component to the other may be transported by electrical signals being directly or indirectly (e.g. via intermediate circuits) transported from one component to the next.

Apparatuses 100 according to embodiments of the present invention may, for instance, be implemented as circuits, processor-based systems. In other words, apparatuses 100 according to embodiments of the present invention may be implemented in a large variety of different forms. The term "apparatus" is therefore understood to be summarizing for the large variety of different implementations.

With reference to FIG. 2, a mode of operation of the apparatus 100, according to an embodiment of the present invention, will be described in more detail. FIG. 2 comprises three partial FIGS. 2a, 2b, and 2c, which illustrate examples of the time-domain RF signal 110, the frequency-domain representation 130, and the reduced representation 150, respectively. FIG. 2a shows a graphical representation of an exemplified time-domain RF signal 110 with a signal strength s as a function of time t. After being provided to the time/frequency converter 120 as shown in FIG. 2a by an arrow connecting the partial figures a and b, the frequency-domain representation 130 is output by the time/frequency converter 120. The frequency-domain representation 130 is illustrated in FIG. 2b as a discrete representation of a distribution of the intensity I over the respective frequencies f. Alternatively, the frequency-domain representation 130 may also be a power spectrum distribution (PSD) or a another energy-related distribution.

The frequency-domain representation 130 is then provided to the entropy encoder 140 which is also represented in FIG. 2 by an appropriate arrow interconnecting partial figures b and c. The entropy encoder 140 transforms or encodes the frequency-domain representation 130 into an entropy encoded reduced representation 150.

It should be noted that the application shown in FIG. 2 is based on a discrete time-domain RF signal 110, which becomes apparent when considering the fact that in the example shown in FIG. 2, the time/frequency converter 120 produces a discrete frequency-domain representation 130. Embodiments according to the present invention are, however, by far not limited to processing discrete signals, although in practical implementations this may be the most important application. In many practical applications, the signals to be processed will further be digitized and be provided to the apparatus 100 according to an embodiment of the present invention in a binary-coded form or a form based on a binary representation. However, it should be noted that in principle also analog and non-discretized signal processing circuits may be used.

Figure 3:
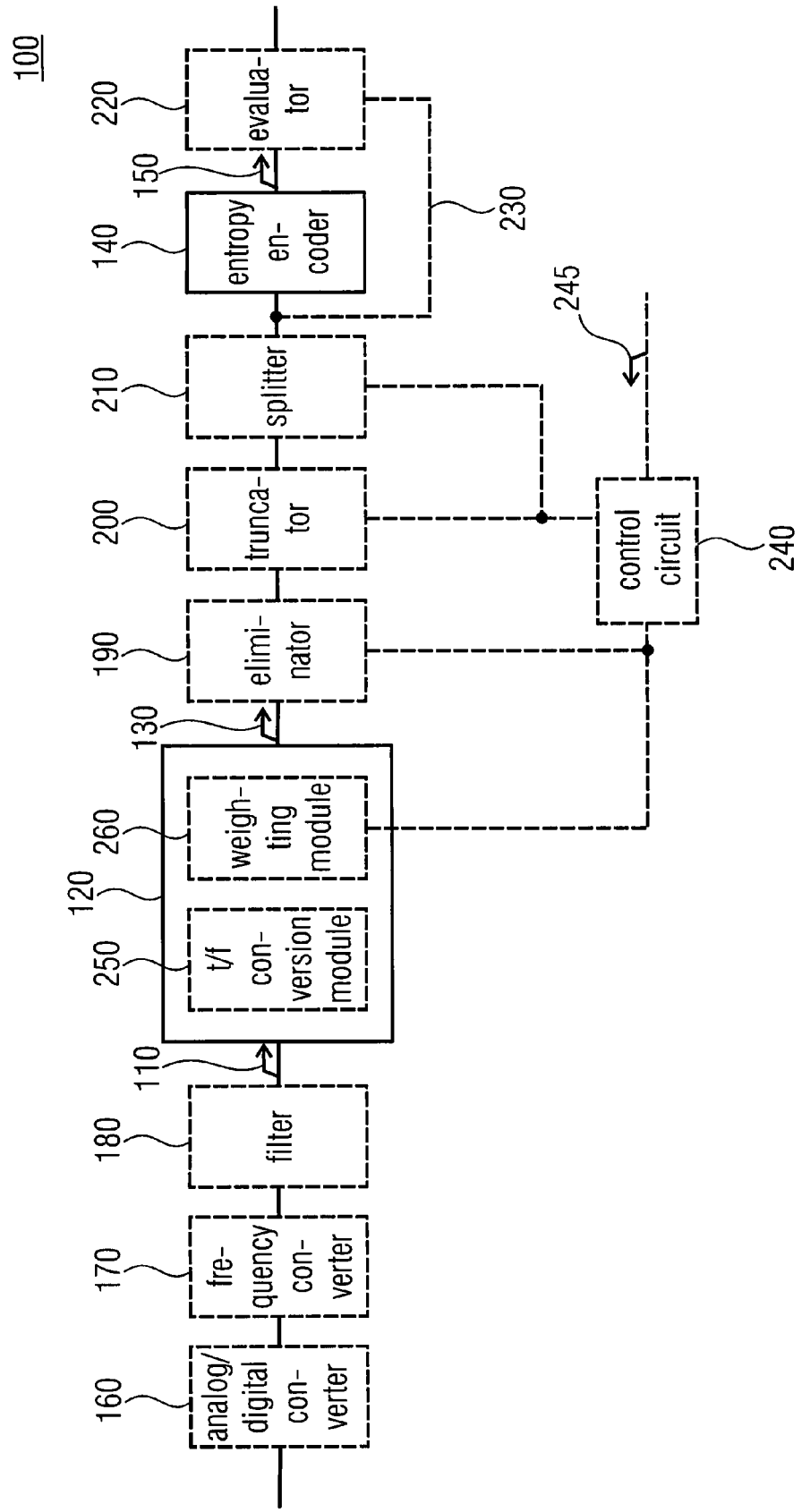
FIG. 3 shows a block diagram of an embodiment according to the present invention.

FIG. 3 shows a further embodiment of an apparatus 100 for providing a reduced representation in a frequency domain based on a time-domain RF signal 110. The apparatus 100, however, is a more complex version of the apparatus 100 shown in FIG. 1, which comprises, apart from the time/frequency converter 120 and the entropy encoder 140, additional optional components.

The apparatus 100 comprises as a first optional component an analog/digital converter 160 (A/D converter or ADC) to which an analog signal may be provided. To an output of the analog/digital converter 160, an optional frequency converter 170 is coupled, which is followed by an optional filter 180. At an output of the filter 180, the time-domain RF-signal 110 is then provided to the previously described time/frequency converter 120. At an output of the time/frequency converter 120, the frequency-domain representation 130 is provided to an optional eliminator 190. The signal as output by the eliminator 190 is then provided to an optional truncator 200 and/or to a splitter 210. The output of the splitter 210 is then provided to the entropy encoder 140, at the output of which the reduced representation 150 in the frequency domain is provided to an evaluator 220. An input of the evaluator 220 is furthermore coupled to the input of the entropy encoder 140 via a bypass line 230.

The apparatus 100 may further comprise, as an additional component, a control circuit 240 with an input to which a control signal 250 can be provided. The control signal may, for instance, be provided by a user via an appropriate control panel, a computer system, which is not shown in FIG. 3, or by any of the components shown in FIG. 3, for instance, by the entropy encoder 140, or the evaluator 220. Output-wise, the control circuit 240 may also be coupled to all of the components such as shown in FIG. 3, including the time/frequency converter 120, the eliminator 190, the truncator 200, or the splitter 210.

The time/frequency converter 120 may furthermore comprise, as internal components, a time/frequency conversion module 250, and a weighting module 260. In this case, the weighting module 260 may also be coupled to an output of the control circuit 240.

Concerning the mode of operation of the apparatus 100, as shown in FIG. 3, an input signal may be received by the apparatus 100 via a means not shown in FIG. 3, which may be formed by an input, an antenna, or a receiving circuit of some sort. The input signal is then provided to the analog/digital converter 160 which transforms the analog signal into a digital and discrete version thereof. Based on this digital and discrete version of the input signal, an optional frequency converter 170 may adapt the underlying frequency of the signal in case the frequency is to be increased or decreased, such as by mixing down the signal by interpolating the signal or by another appropriate technique. The optional frequency-converted signal is then provided to the filter 180, which in turn, may filter out undesired frequency components, which may for instance by created due to the frequency conversion or the analog/digital converter 160. As outlined before, at the output of the filter 180, the actual time-domain RF signal 110 is then provided to the time/frequency converter 120.

As previously outlined in the context of FIG. 1, the time/frequency converter 120 is adapted to transform the time-domain RF signal 110 into the frequency-domain to obtain the frequency-domain representation 130 output by the time/frequency converter. To achieve this, the time/frequency converter 120 may for example comprise the time-frequency conversion module 250 performing the actual conversion from the time-domain into the frequency-domain. The time/frequency conversion module 250 may be adapted to perform a Fourier transformation, a Fast Fourier Transformation (FFT), or another technique to convert the incoming time-domain signal into the frequency-domain or a closely related domain.

The weighting module 260 may then be adapted to apply a weighting function to the output of the time/frequency conversion module 250 to suppress one or more portions of the signal in the frequency domain. Alternatively or additionally, the weighting module 260 may also enhance or boost certain frequencies if needed. For instance, in the case of suppressing at least one portion of the frequency-domain representation, as provided by the time/frequency conversion module 250, intensity or other energy-related values inside the portion may be set to a predetermined value (e.g. energy value zero), or to any value in a certain range of values. This may, for example, be implemented by setting one or more of the values inside the respective portion of the frequency-domain representation to zero, or to a value below a predetermined threshold, such as a value below wherein $b^{-t}$, is an integer indicating a basis (e.g. 2, 10) and t is a positive integer (e.g. 1, 2, 3, 4, 6, 8, 10, 16, 20, 24, 30, 36).

In other words, the frequency-domain representation 130 is output by the time/frequency converter 120 may not only be a 1:1-representation of the incoming time-domain RF signal 110, but may also be modified by applying a weighting function. In case the weighting module 260 is implemented, it may be advisable in at least some applications to implement the time/frequency conversion module 250 to be operating in an overlapping mode.

In the overlapping mode, the time/frequency conversion module 250 is typically adapted to operate on a frame size being larger than a frame size of the incoming time-domain RF signal 110. In other words, in case the time-domain RF signal 110 is frame-based, each frame of the RF signal 110 comprising M values, wherein M is a positive integer, the time/frequency conversion module 250 is typically adapted to operate on a frame size being larger than M. For instance, in the case of an FFT implementation of module 250, the frame size on which module 250 operates may for example be 2·M. As a consequence, the signal or representation provided by the time/frequency conversion module 250 then comprises a finer frequency resolution in the overlapping mode, compared to a direct mode of operation, when the frame sizes of the RF signal 110 and of the frequency-domain representation output by module 150 are the same. In case the weighting module 260 is implemented, the overlapping mode of operation may be beneficial to the signal quality since it may reduce aliasing effects or the like. Technically, this may be achieved by extending the frame of RF signal values with zeros. This is also referred to as zero-padding. Naturally, also other padding-schemes may be employed.

The eliminator 190 to which the frequency-domain representation is supplied may then analyze the incoming signal and determine, based on the signal properties, as to whether one or more portions of the frequency-domain representation fulfill a predetermined or predefined condition. In this case, the eliminator 190 may then discard the respective values or set the respective values to zero or another value inside a predetermined range of values. Although the eliminator 190 may in some implementations replace the weighting module 260 of the time/frequency converter 120, it should be noted that in many applications the weighting module 260 and the eliminator 190 serve a different purpose. The eliminator 190 is intended to reduce the amount of data to be transferred by neglecting values in portions of the frequency-domain representation, while the weighting module 260 is intended to select portions of the frequency-domain representation to be further processed inside or outside the apparatus 100. However, details of the eliminator 190 will be outlined below in context with FIGS. 8 to 15.

The truncator 200 represents a further manner in which the amount of data to be transferred can be reduced. On the basis of a time/frequency converter 120 providing the frequency-contributions with a fixed resolution, the truncator 200 may be used to reduce the resolution such as by truncating certain bits. For instance, in the case that the time/frequency converter 120 provides the spectral data with the resolution of 16 or 18 bits, it may become advisable to for example by reducing the resolution to 14 bits, in case the amount of data to be transferred outside the apparatus 100 exceeds a maximum allowable value to still allow a real-time analysis. Although this would in most cases result in an increased noise level, in some applications this may be acceptable to still allow a real-time processing of the data.

The splitter 210 may also be used to reduce the amount of data to be transported. It cooperates with the entropy encoder 140 in the sense that the splitter 210 is adapted to separate an incoming frame of the frequency-domain representation into a first and second part, which is then entropy encoded separately by the entropy encoder 140. The splitter 210 may be beneficial in case the values of the frequency-domain representation provided to the entropy encoder 140 are comparably long and the distribution such that the codebooks used by the entropy encoder 140 also become comparably long. In this case, it may be advisable to split the values of the frequency-domain representation into two or more parts. For instance, in the case of a high-resolution time-frequency converter 120 operating on 22 bits, the codebooks used by the entropy encoder 140 may become large. In this case, it may be beneficial to split the values of the frequency-domain representation into two or more parts, such as a 12-bit part and a 10-bit part, two 12-bit parts wherein 2-bits may then be safely set to zero, or three 8-bit parts. In other words, the splitter 210 may be adapted to split at least one value of a frequency-domain representation into a plurality of parts, wherein each part of the plurality of parts comprises a lower number of digits than the value of the frequency-domain representation and wherein the entropy encoder 140 is adapted to encode the parts of the value.

However, even when implementing the splitter 210, it may occur that the total amount of data generated by the apparatus 100 may be larger after entropy encoding the respective data compared to transmitting the respective data directly in an unencoded form. To evaluate as to whether entropy encoding by the entropy encoder 140 is beneficial, in some embodiments according to the present invention, an evaluator 220 may evaluate the output of the entropy encoder 140 (the reduced representation 150), and the frequency-domain representation provided to the entropy encoder 140 via the bypass line 230. The evaluator 220 may then be adapted to compare the amount of data and to provide to an output of the apparatus 100 (not shown in FIG. 3), either the entropy encoded reduced representation 150 or the frequency-domain representation provided to the input of the entropy encoder 140, which ever leads to a lower amount of data to be transferred. In other words, the evaluator 220 may be considered to be a switch passing on either the reduced representation 150 as output by the entropy encoder 140 or the frequency-domain representation 130 provided to the input of the entropy encoder 140, depending on which of the two comprises less data to be transferred.

Embodiments according to the present invention in the form of an apparatus 100 or a corresponding method offer the possibility of transmitting digitized RF signals in an effective manner. Situations may occur when not using the entropy encoder 120 may be beneficial. However, in most cases applying the entropy encoder 140 to the frequency-domain representation 130 as provided by the time/frequency converter, or to a corresponding frequency/domain representation based on the output of the time/frequency converter 120 will be efficient and therefore beneficial. Tests have shown that in many cases a signal having a resolution of 2-times 32-bits for the real part and the imaginary part of complex-valued FFT-data can be compressed to approximately 3.5-bits per sample.

Figure 4:
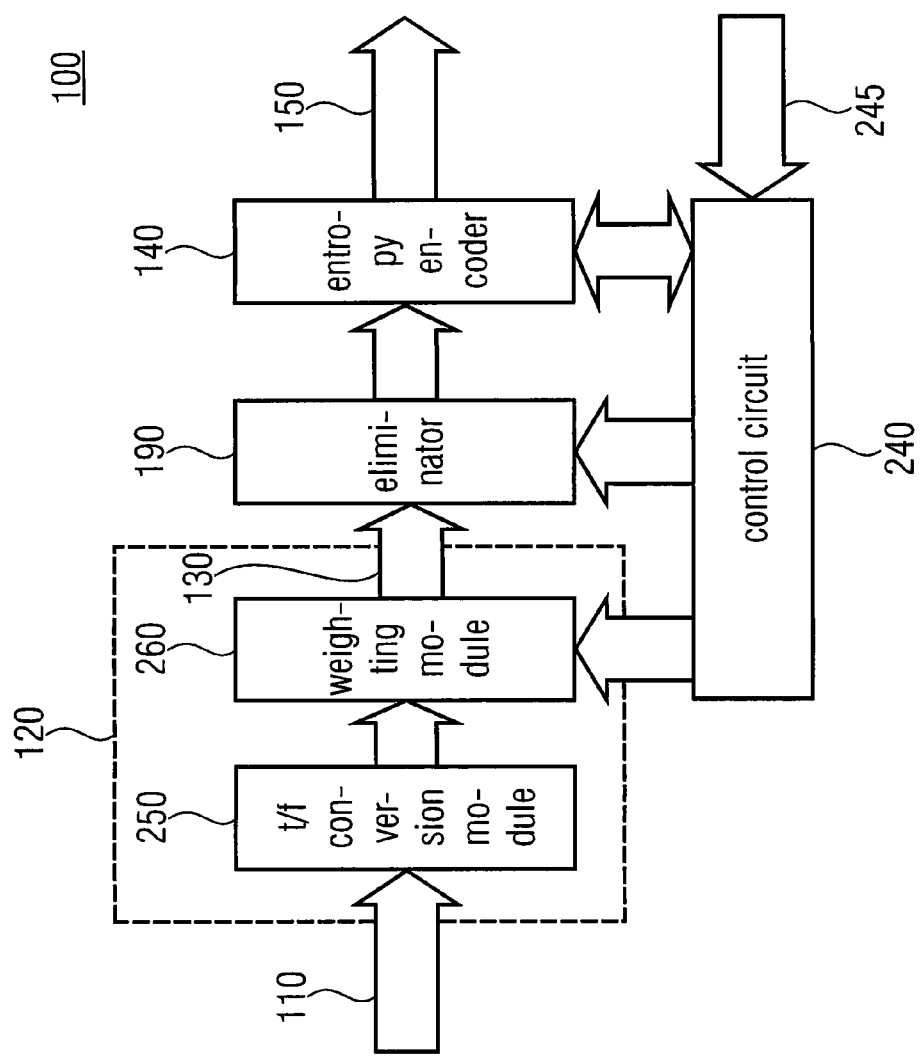
FIG. 4 shows a block diagram of a further embodiment according to the present invention.

FIG. 4 shows a block diagram of a further embodiment according to the present invention of an apparatus 100. It is worth noting that the block diagrams as shown in FIGS. 1, 3 and 4 do not only represent a physical structure of the apparatus 100, but may also be interpreted as a flowchart of a corresponding method or algorithm according to an embodiment of the present invention.

The apparatus 100 also comprises a time/frequency converter 120, which in turn comprises a FFT-based time/frequency conversion module 250 operating in an overlapping mode and a weighting module 260, which weights on the basis of one or more weighting functions the data provided by the time/frequency conversion module 250. In between the time/frequency converter 120 and an entropy encoder 140, an eliminator 190 is placed, which eliminates unused frequency bins or values of the frequency-domain representation 130 as output by the time/frequency converter 120. As outlined before, the entropy encoder 140 performs the entropy coding and provides the reduced representation 150 as an output datastream.

The apparatus 100 also comprises a control circuit 240 which allocates the available bandwidth based on a control signal 245 that may for instance comprise a user request or other control data. The control circuit 240 is coupled to the weighting module 260, the eliminator 190, and the entropy encoder 140 to exchange or to provide certain data to the respective components and modules. To be slightly more specific, the control circuit 240 performs the bandwidth allocation on the basis of output data provided by the entropy encoder 140. Furthermore, the control circuit 240 may optionally be adapted to switch between different modes of the entropy encoder 140. The control circuit 240 may furthermore provide to the eliminator 190 information concerning used or needed bins, which are to be preserved under all circumstances. Moreover, the control circuit 240 may provide coefficients to the weighting module 260 of the time/frequency converter 120 indicative of the weighting function to be used.

In other words, to summarize, the apparatus 100 or its corresponding algorithm is supplied with time-domain data in the form of the RF signal 110 which may for example be created by digitizing RF signals using an analog/digital converter (not shown in FIG. 4) with an optional subsequent frequency conversion and filtering stages (not shown in FIG. 4).

As previously outlined, the data of the time-domain RF signal 10 is first of all transferred into the frequency-domain using a FFT-based time/frequency converter 120. In most cases, it might be advisable to use overlapping FFT-based converters, unless the weighting function is constant and no frequency bins are eliminated. However, a non-overlapping FFT-based time/frequency converter 120 may also be used.

A user, an external system, or an external software program may determine which portions of the digitized frequency-domain representation are of interest and which may be safely eliminated. The weighting function as implemented in the weighting module 260 reflecting the desired frequency response is created and multiplied with the frequency-domain data coming from the FFT-based digitized frequency conversion module. In case the weighting module 260 is implemented and active, the weighting function will usually set a number of frequency bins comprises in at least one portion of the frequency-domain representation to zero, or to another predetermined value which are then eliminated in the next step by the eliminator 190. In some embodiments according to the present invention, it may be advisable to eliminate unused frequency bins prior to applying the weighting function. Therefore, the order of the different modules may vary from embodiment to embodiment.

For instance, in some embodiments according to the present invention, the order of the weighting module 260 and of the time/frequency conversion module 250 may be exchanged with respect to each other inside the time/frequency converter 120. Concerning the other optional components as shown in FIG. 3, the order is typically also not mandatory. For instance, the order of the eliminator 190, the truncator 200, and the splitter 210 may be almost arbitrarily changed. Finally, entropy coding is applied to the data of the frequency-domain representation 130, which may have been processed by the eliminator 190 as shown in FIG. 4. The entropy encoder may, for example, be based on the encoding schemes according to Rice, Golomb, Huffman, or the Arithmetic coding scheme.

However, an apparatus 100 as illustrated in FIG. 4 may additionally comprise components which have been shown in FIG. 3. For instance, in order to facilitate the coding process it may be advisable to split the data words or values of the frequency-domain representation 130 provided to the entropy encoder (e.g. 16-bits) into two or more separate words (e.g. 8-bits for a lower byte and 8-bits for the higher byte, in respect of two words) and encode them independently. To achieve this, the splitter 210 may by introduced between the eliminator 190 and the entropy encoder 140, as outlined above in context with FIG. 3.

In other words, the signal as provided, for example by an analog/digital converter, which may include a decimator and a digital down conversion as outlined above, may be processed with overlapping FFT-based time/frequency converters as will be described in more detail below. Next, frequency-domains or portions of the frequency-domains representation 130 may be discarded while those frequency bins which are of interest and which may form at least one further frequency portion of the frequency-domain representation may be extracted from the spectra. Next, to reduce the redundancy in the data, the entropy encoding is applied to the frequency-domain representation using, for example, the above-referenced algorithms.

Figure 5:
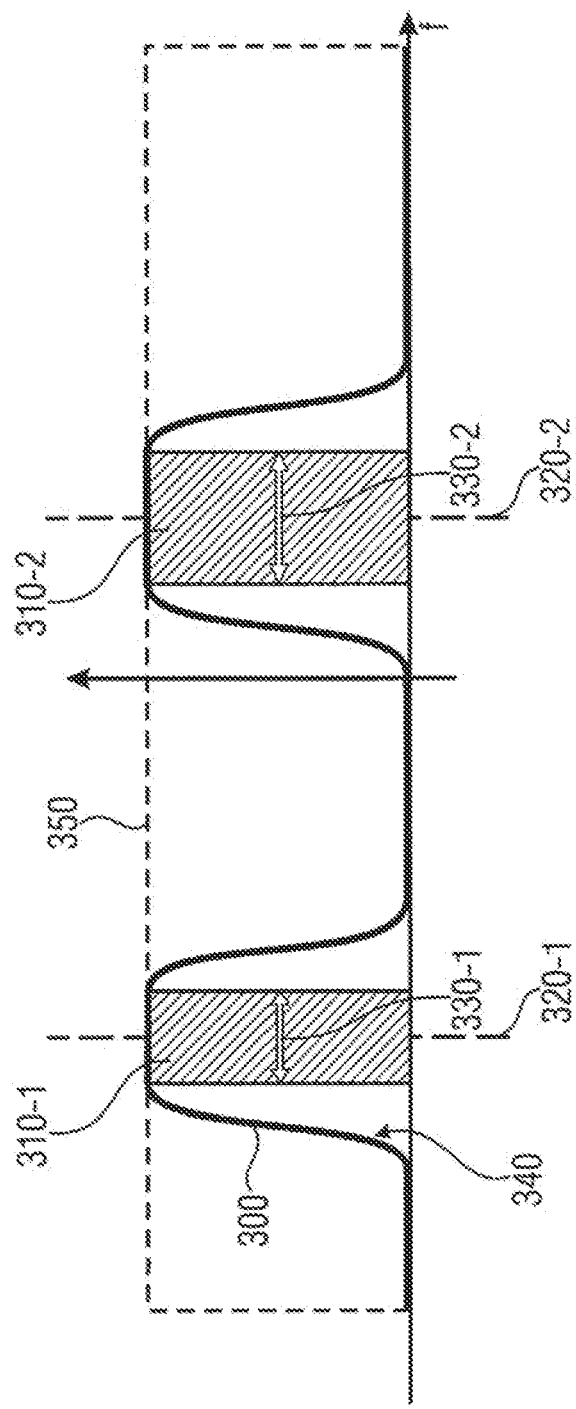
FIG. 5 illustrates an application of a weighting function in the framework of the time/frequency converter according to an embodiment of the present invention.

FIG. 5 shows an example of a weighting function 300 with two frequency regions 310-1, 310-2, which are centered around corresponding center frequencies 320-1, 320-2, respectively. Each of the two frequency regions 310 comprise a frequency width 330-1, 330-2, in the range of which the weighting function 300 takes on higher values than outside the frequency regions 310, leading to a reduction of the values of the frequency domain representations after being processed based on the weighting function 300 inside the weighting module 260.

In embodiments according to the present invention, the value which the window function 310 takes on inside the frequency regions 310 is constant, and when multiplying the weighting function with the values of the frequency-domain representation as output by the time-frequency conversion module 350 is equal to one. Outside the transition region 340 in which the weighting function drops from the value inside the frequency regions 310 to its value outside, the weighting function typically acquires a value of zero or very small values to reduce the significance of these values, after being processed by the weighting module 260.

As illustrated in FIG. 5, the shape of the weighting function 300 reduces the total bandwidth of the input signal 350 to the frequency regions 310. Since the weighting function 300 along with the frequency regions 310 may be chosen, the frequency regions 310 represent subbands of interest.

For the sake of completeness only, it should be noted that the number of frequency regions 310, their respective center frequencies 320, and the width 330, may be chosen based on the requirements of the actual application. For instance, the number of regions 310 may be chosen almost arbitrarily. In other words, the number of frequency regions 310 may in principle be any number larger or equal to zero. In principle, any combination may be implemented in terms of the center frequencies 320 and the frequency widths 330.

However, as the amount of data reduction is typically dependent on the amplitude distribution or intensity distribution of the spectral data and is typically not constant. Therefore, it may be advisable to implement a feedback means to reduce the amount of data to be transported over the network, if needed. In other words, it may be advisable to implement an irrelevance reduction.

To achieve this, three mechanisms or any combination thereof may be used. These mechanisms may, for instance, be implemented via the control circuit 240 as shown in FIGS. 3 and 4.

First of all, it may be possible to employ an automatic reduction of the signal bandwidth around the center frequencies 320 of the subbands or frequency regions 310 by automatically reducing, if needed, the frequency width 330. Additionally or alternatively, a reduction of the bandwidth of the subbands or frequency regions 310, depending on priorities entered by a user, may be used. In this case, those segments or frequency regions 310 which are of least interest to the user may be dropped first by automatically adjusting the weighting function 300.

As a third possibility, the entropy encoder 140 and its operation may be influenced by reducing the word length of the values comprised in the frequency-domain representation 130. More specifically, this may be done by implementing a truncator 200 or by directly influencing the entropy encoder 140. In many cases, this results in a degradation of the signal-to-noise ration within the whole subband or frequency region 310, which may however be acceptable in applications that employ large bandwidths at limited signal-to-noise ratios. An example for such an application is a satellite transmission.

In combination with the eliminator 190, experimental data using actual radio spectra show that a reduction of the data ratio between 50% and up to 90% is achievable. As will be detailed later below, this can be performed by using a noise ridding threshold algorithm (NRT), which automatically adjusts the data rate coming out the of the entropy encoder 140. If a certain limit is exceeded, the noise ridding threshold will automatically be set to a higher level. Channels having less energy than defined by the noise ridding threshold will be suppressed or reduced after the FFT-based time/frequency conversion module using an appropriately defined weighting function 300. The weighting function 300 may then be chosen so that it minimizes the energy of unused channels and does not substantially affect the signal quality of the channels containing higher energies.

As outlined above, the time/frequency converter 120 by far need not comprise a weighting module 260 along with a correspondingly defined weighting function 300. These are optional components which may be beneficial in some applications, but which are by far not needed and may even lead to some negative impacts in some applications. In other words, in principle the "weighting function" may be defined to be constant so that a reduction of the bandwidth is not given. In this case, the time/frequency conversion module 250 is not needed to be implemented using an overlap. As a consequence, it may be possible to avoid an increase of the data rate, when compared to processing the time-domain RF signal 110 in the time-domain, and yet to profit from the entropy encoding.

As a kind of "fail-safe mechanism" it may be possible to implement the evaluator 220 as described in context with the apparatus 100 shown in FIG. 3. In case entropy coding the frequency-domain representation may result in an increased data rate, it may be possible to use the non-entropy encoded frequency-domain representation instead of its entropy-encoded version. This can be achieved by implementing the evaluator 220 along with its bypass line 230, and by choosing either the frequency-domain representation in its entropy-encoded form or in its non-entropy encoded form.

Before further details concerning the eliminator 190 will be described, first of all an application of an apparatus 100 is to be described. Using and implementing an apparatus 100 according to an embodiment of the present invention may eventually lead to a significant improvement of such a system. The application is taken from the field of radio communication surveillance systems. However, embodiments according to the present invention can be applied whenever RF signals are digitized and transported via digital links (e.g. GBIT Ethernet, SATA, or fiber optics) to equipment performing further processing or storage. Due to its operational principles as laid out above, embodiments according to the present invention will increase the bandwidth that can be substantially processed. The following will describe an application of an embodiment according to the present invention in the framework of a signal collection system for a HF/VHF/UHF receiver (HF=high frequency; VHF=very high frequency, UHF=ultra high frequency). The signal collection system offers an excellent RF performance, a powerful signal processing, and is capable of multi-channel operations and comprises a Gigabit LAN interface (LAN=local area network). The system described comprises a high linearity, low noise and is able to process up to 120 MHz real-time bandwidth signals.

Figure 7:
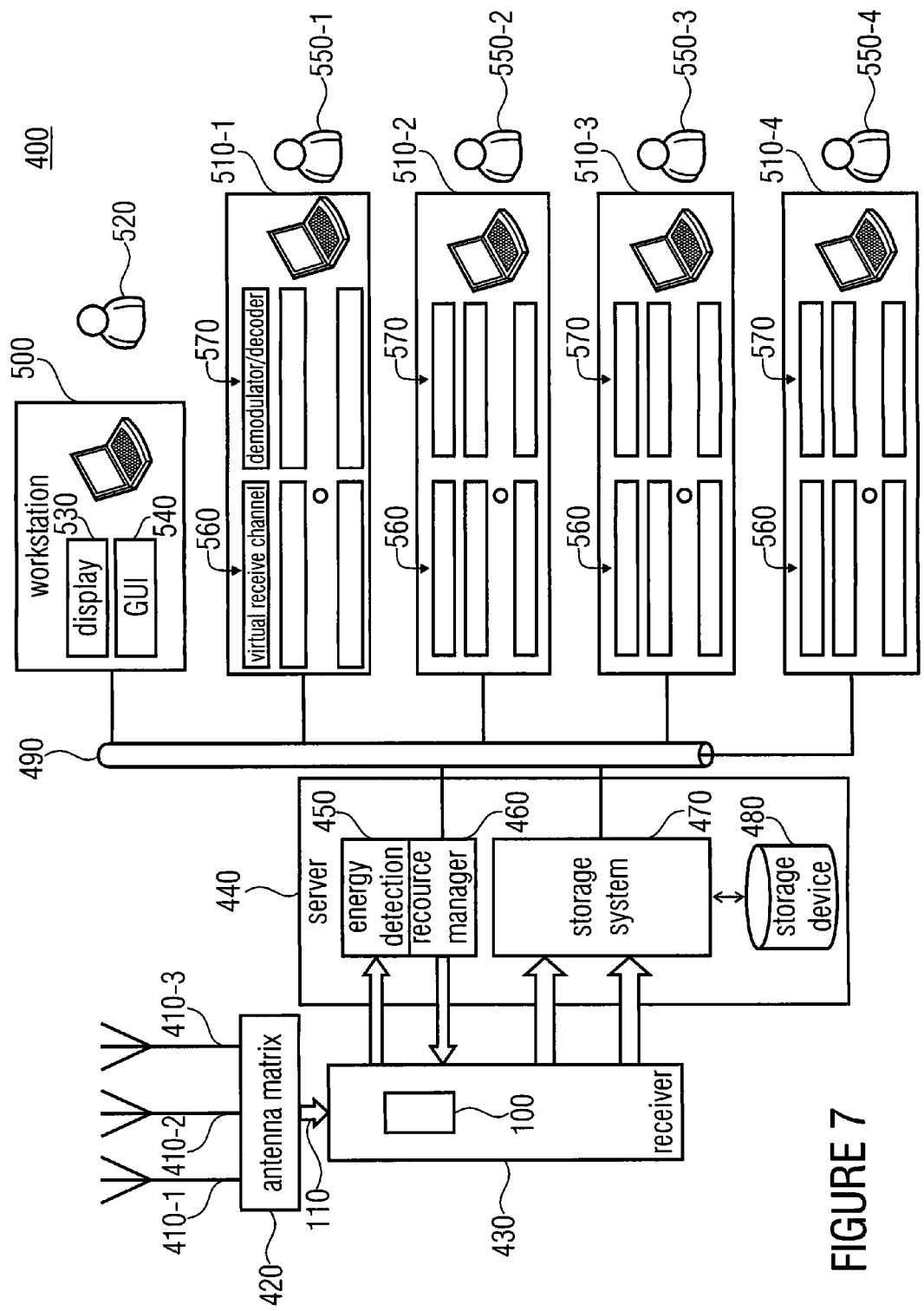
FIG. 7 illustrates a system comprising a receiver with an apparatus according to an embodiment of the present invention which may be used to process the example given in FIG. 6.

The signal collection system, which will be shown in FIG. 7, is a highly effective COMINT system (COMINT=Communication Intelligence). Due to its efficient design, an advanced receiver technology and superior software architecture, it offers the user an optimum coverage of a given frequency bandwidth and a minimum of hardware.

The signal collection system uses a receiver with a bandwidth extension. The receiver is equipped with small antenna matrices with three inputs. They may be used to connect a HF antenna (typical frequencies F=1-30 MHz), VHF antenna (typical frequencies F=20-1000 MHz), and UHF antennas (typical frequencies F=1000-3000 MHz). The receiver has an instantaneous bandwidth of 120 MHz. It is capable of acquiring up to 120 MHz wide high-resolution spectrum (power spectrum distribution (PSD)) and to stream the acquired data at least partially to a Gigabit network. Due to an implementation of an apparatus 100 according to an embodiment of the present invention, it may be possible to achieve reduction or compression levels high enough to provide the spectral data via a single, two or a few Gbit-LAN ports only. At the same time, it is capable of acquire subbands from anywhere from within this bandwidth up to a total bandwidth depending on a great variety of parameters. The data is sent to a Gigabit network for further processing.

Figure 6:
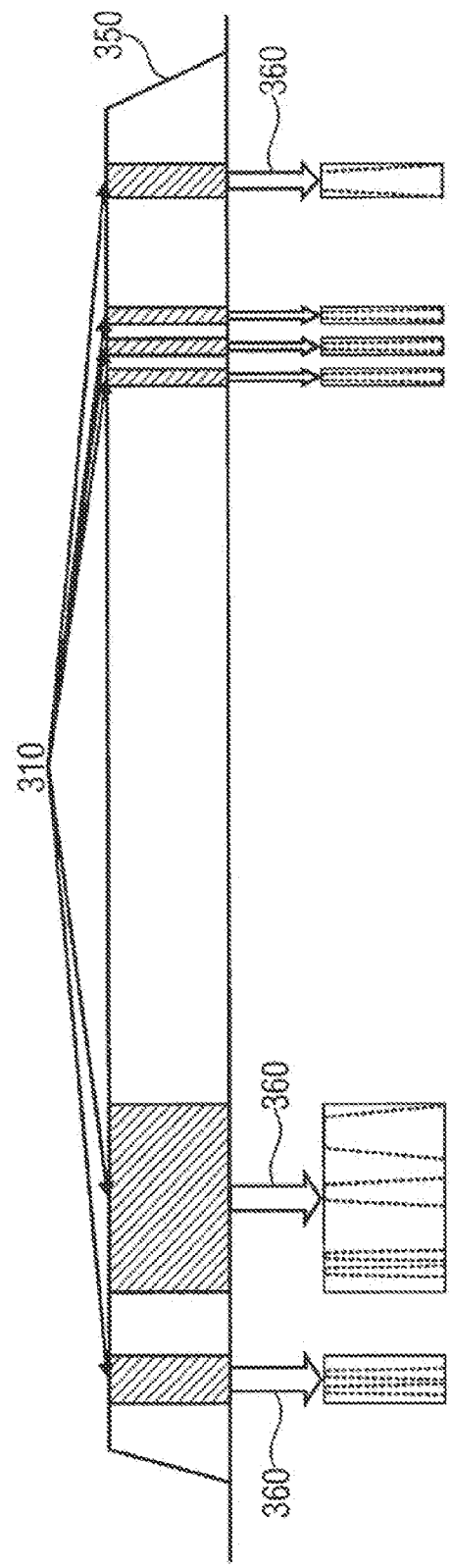
FIG. 6 illustrates an operation of an application comprising an apparatus according to the present invention in the field of analyzing radio frequency transmissions.

The signal processing takes place in two steps, as depicted in FIG. 6. First of all, the receiver comprising an apparatus 100 according to an embodiment of the present invention extracts subbands of frequency regions 310 within its 120 MHz frequency bands. FIG. 6 shows a total of six active subbands or frequency regions which are taken from a 120 MHz total receive bandwidth 350.

In a next step, illustrated by arrows 360, these subbands or frequency regions 310 are then distributed to work stations, breaking the frequency bands down into individual channels for demodulation and analysis. As shown in FIG. 6, each of the frequency regions 310 may comprise one or more individual channels 370.

The system used for this processing concept is shown in more detail in FIG. 7. FIG. 7 shows a block diagram of the signal collection system 400 used. The system 400 comprises three antennas 410-1, 410-2, and 410-3, for the three previously mentioned frequency ranges HF, VHF, and UHF, respectively. The three antennas 410 are then coupled to an antenna matrix 420, which in turn provides an appropriate RF signal 110 to a receiver 430 comprising an apparatus 100 according to an embodiment of the present invention.

The system 400 further comprises a server 440 which is coupled to the receiver 430. The server 440 comprises an energy detection module 450, a resource manager 460 and a storage system 470 along with at least one storage device 480. The server 440 is coupled to the receiver 430 to allow an exchange of 120 MHz wide high-resolution spectra (PSD) with the energy detection module 450 and to provide the receiver 430 with requests for active segments from the resource manager 460. Furthermore, the receiver 430 and the server 440 are coupled to enable the receiver 430 to provide the storage system 470 with narrow band spectra and cumulative bandwidth I/Q data of a predefined value, which typically depends on a great variety of different parameters. By implementing an apparatus 100 according to an embodiment of the present invention, higher data rates and, consequently, higher bandwidths may be achievable due to the possible reduction.

The server 440 is coupled to a computer network 490, which may, for instance, be a LAN (local area network). The computer network 490 is furthermore coupled to a supervisor workstation 500 and a plurality of operator work station, of which four are shown in FIG. 7. For the sake of completeness it should be noted that a number of operator workstations 510 as well as the number of supervisor workstations 500 may differ.

In the system 400 shown in FIG. 7, the supervisor workstation 500 operated by a supervisor 520 comprises a 120 MHz panorama spectrum display 530 and an appropriate supervisor graphical user interface 540 (supervisor GUI). Each of the operator workstations 510 operated by operators 550 each comprise a plurality of virtual receive channel modules 560 and a corresponding number of demodulators and decoders 570.

In operation, the receiver 430 comprising the apparatus 100 according to the embodiment of the present invention continuously provides 120 MHz wide-spectrum information around its assigned centre frequency. A spectrum is the input to an energy detection algorithm as implemented in the energy detection module 450. The algorithm identified active sub bands within this 120 MHz wide frequency range.

The data is then transported via the resource manager 460 and the computer network 490 to the supervisor workstation 500. The spectrum is then displayed on the workstation 500 of the supervisor 520 who can define frequency bands of interest or excluded portion and parts of the frequency band. The supervisor 520 is also able to specify which sub bands are routed to the individual work station 510 for analyses by the operators 550.

To facilitate this, the supervisor 520 is able to provide his commands via the supervisor graphical user interface 540 and the computer network 490 to the resource manager 460 as comprised in the server 440. The resource manager algorithm as implemented in the resource manager 460 combines the inputs from the supervisor 520 with the output from the energy detection module 450 and commands the receiver 430 to provide digitalized real-time content from those portions of the band which are active and/or of interest. In order not to miss an accountant all sub bands are simultaneously sent to a recording system comprising the storage system 470 along with the at least one storage device 480.

The individual workstations 510 let the operators 550 then breakdown the sub bands into channels by their virtual receive channel modules 560 as adequate for the signals being intercepted. The data coming from the virtual receive channel modules 560 are then demodulated and decoded by the demodulator and decoder 570. A spectrum display of the respective sub bands is available to the operators 550. The operators 550 at the workstations 510 can browse and demodulate the collected material in a real-time, irrespective whether it was already recorded in the past or is currently received.

Typically, demodulators and further, third party decoders reside in the workstations 510. The system concept as illustrated by the system in FIG. 7 allows the workstations to perform real-time frequency hopper detection and demodulation.

To summarize, the receiver 430 is capable of continuous spectra monitoring with a bandwidth up to 120 MHz in a system shown in FIG. 7. The frequency range of the receiver such as a IZT30000-EB in a standard configuration is 9 kHz up to 3 GHz, while extension to 18 GHz is possible. However, also larger or smaller frequency ranges may be used. An instantaneous bandwidth up to 120 MHz is provided and an analogue bandwidth may be reduced to 30 MHz. The receiver comprises in the configuration shown in FIG. 7. A Gbit-LAN 490 is capable of continuous streaming bandwidth via the computer network 490 (LAN) with a bandwidth which may depend on a great number of parameters, including the achievable compression or reduction under specific circumstances. The recording and management system as implemented in the server 440 is capable of a continuous recording and comprises at least a storage capacity of 4 terabyte (TB). The workstations 500, 510 may be implemented as laptop computers and should be able to process a maximum bandwidth of 6 MHz. Typically, a number of sub channels provided to each of the workstations 510 of the operators 550 is around 20, but may depend on complexity of the decoder. In other words, the number of sub channels may either be higher or lower.

As outlined above, the receiver 430 comprising the operators 100 according to an embodiment of the present invention may be adapted to provide only the sub bands or portions of the spectra which are requested by the supervisor 520. In many applications, such as the system 400 shown under FIG. 7, the amount of data sent by the receiver 430 to the server 440 is significant since all data received and processed by the receiver 430 are to be provided to the server 440. While the computer network 490 connecting the server with the workstations 500, 510 may be implemented in a star-like configuration with parallel ports for reach of the workstations so that the amount of data exchange between the server 440 and the workstations 500, 510 is in many cases not as problematic as the amount of data exchange between the receiver 430 and the server 440.

As consequence, using an apparatus 100 according to an embodiment of the present invention to reduce the amount of data to be transferred in the framework of the receiver 430 may be advisable. Depending on the concrete implementation and the circumstances of its operation, a weighting function as implemented in the time-frequency converter of the apparatus 100 may be used to narrow the bandwidth of the frequency data to be transported. However, even without the implementation of the weighting module 260 in the apparatus 100, by using the entropy encoder 140 alone in context with the time-frequency converter 140 alone in context with the time-frequency converter 120 of the apparatus 100, a reduction of the amount of data may be achieved, which may be used to extend the receiving bandwidth of the receiver 430 in case the data rate of the network connection between the receiver 430 and the server 440 is fixed. Naturally, the free bandwidth gained by employing an apparatus 100 according to an embodiment of the present invention may be used differently, for instance, to improve a narrow tolerance or another signal-related property.

As indicated above, in the following more details of a possible implementation of an eliminator 190 will be given. The eliminator 190 as, for instance, shown in FIGS. 3 and 4, may comprise a unit or an apparatus for frequency-selected determination of the occupancy of a channel in the frequency band comprising a detector to detect an input spectrum in the frequency band. It may further comprise a provider for providing frequency nodes based on receiving level values of the received spectrum. It may also comprise a module for providing a threshold function in the frequency band based on the provided frequency nodes and the node level values at the frequency nodes along with a module to compare a current power of the input values in the respective channel with a comparison power in the channel given by the threshold function to determine the occupation or non-occupation of the channels based on this comparison.

Such a unit may, furthermore, be adapted to detect a reception spectrum multiple times over time. The module for providing the support frequencies may be adapted to change a difference between neighboring frequency nodes with increasing frequency in the frequency band by a change factor. The difference of neighboring frequency nodes may increase with increasing frequency in the frequency band.

In some embodiments, the eliminator may be adapted such that the module for providing the support frequencies may provide the support frequencies for the frequency band based on a table or a lock-up table. The frequency band may comprise the start frequency and an end frequency, wherein the module to provide the support frequencies is adapted so that neighboring support frequencies are selected such that a first support frequency is identical to the start frequency and a last support frequency is identical with the end frequency, wherein the frequencies are identical based on a tolerance range. In this case, the module may be adapted to bring the start and end frequency with the first and last support frequencies in line by applying a new method. The method will be outlined below in more detail.

In further embodiments according to the present invention the node level values may be determined based on consecutive receiving level values. The consecutive receiving level values may then be used to create a histogram and the support level values may be determined based on low power level threshold in the histogram or based on certain, predefined distance to the lower power threshold.

In further embodiments according to the present invention, an average of consecutive reception level values may be determined and a result of the average may be used as a new reception level value.

As outlined above, the eliminator 190 as comprised, for instance in FIGS. 3 and 4, is adapted to remove at least one portion of the frequency-domain representation, wherein a signal property of the portion of the frequency-domain representation fulfils a predetermined condition. Eliminators 190 may be formed on a whole variety of different strategies. A view of these strategies will be outlined next.

The eliminator 190 may contribute significantly to reduce the amount of data. One approach used by the eliminator 190 is to disregard or to eliminate portions of the frequency regime which are not used or occupied. To be able to perform frequency-selective occupancy measurement (spectrum occupancy) of radio channels, for example, an exact determination of a threshold value may be needed, above which the channel to be measured is classified as currently active, or below which the channel is classified as currently inactive. Furthermore, with frequency-selective occupancy measurement of radio channels, it may also be determined, which radio channels are occupied how strongly over time, and whether the radio parameters, such as the center frequency or maximum field strength, are being observed.

The threshold value may, for example, be set to a power level value, which is measured in dBm, for example, simply in a fixed manner for the duration of the measurement. The disadvantage of this method is that the reception spectrum (power spectral density, PSD) partly changes significantly in the case of a change of the receiver (e.g. the antenna, bandwidth, etc.). Thereby, it may become needed to readjust the threshold value every time.

It is also conceivable to determine the threshold value adaptively from the momentary reception spectrum, for example, by determining the noise floor and adding an offset in decibels (dB), so that the so-called Noise-Riding-Threshold (NRT) is obtained. However, it is a disadvantage of this method that, in real situations, due to the nature of the receiver, there indeed are reception spectra to be measured, which spectra are not flat, but arranged in an increasing or also decreasing manner toward higher frequencies, for example. In this case, the radio channels advantageously are classified as active or as inactive depending on their locations in the reception spectrum, which leads to measurement errors.

Hence, there is a need to be able to perform the occupancy measurement of a radio channel in a manner that is frequency-selective, flexible and as independent of the hardware as possible.

Here, an important aspect is to first determine frequencies for nodes (node frequencies) lying within the frequency range to be measured, and then determine node level values for the respective node frequencies. The computation of the node level values may be done by means of the reception level values of the reception signal, wherein the reception level values are captured by a means (e.g. an input). By interpolation of the node level values, the threshold value course can be obtained. This threshold value course generally depends on the frequency and flexibly adapts to the respective noise floor. With the aid of the threshold value course, it is possible to measure the occupancy of a channel in a frequency-selective manner, which may, for example, be done by comparing the momentary power of the reception level values (of the PSD signal) to the comparative power given by the threshold value course, in order to classify the channel as occupied or not occupied depending on the comparison.

In contrast to conventional technology, the method proposed does not only use one value, but utilizes several values for the adaptive determination of the NRT. These values, also referred to as NRT nodes in the following, consist of a tuple of frequencies (node frequencies) and power levels (node level values). Here, the frequency distance of neighboring NRT nodes may be constant, or become smaller toward higher frequencies, or become greater toward greater frequencies. This means that the frequencies of the NRT nodes are freely adjustable on the basis of some parameters. The power level of the NRT nodes, however, is determined from the momentary reception spectrum and/or a combination of past reception spectra and the momentary reception spectrum (memory). The NRT nodes thus computed may then be interpolated suitably on the basis of the frequencies of the FFT (fast Fourier transform) lines of the reception spectrum, in order to determine the flexibly adapted threshold value course (Noise-Riding-Threshold). So as to be able to perform occupancy measurement therewith, the power of the channel to be measured may finally be compared with the power of the corresponding frequency range of the threshold value course.

The functioning of the algorithm underlying the method according to the invention thus is subdivided into two parts:
(a) determination and adaptation of the NRT nodes (node frequencies);
(b) computation of the NRT (node level values).

At first, the determination and adaptation of the NRT nodes is to be explained in greater detail.

The following type of configuration of the NRT nodes has proved convenient. Subdividing the entire frequency range to be examined into frequency groups is performed. The change or the size increase of the frequency group width from low frequencies is configurable by way of a start frequency (startfreq), a start frequency group width (startbw), an end frequency (endfreq) and a growth factor (geofac). The growth factor describes a geometric series and determines the size increase of the frequency group width. Thus, the following frequencies are obtained for the NRT raster:

$$\text{freq}(i) = \text{startbw} \cdot \frac{1 - \text{geofac}^i}{1 - \text{geofac}} + \text{startfreq}, \, i = 1, \ldots, n. \quad (1)$$

Estimation of the number n of frequencies freq(i) with startfreq≤freq(i)≤endfreq, can be done the following way:

$$\left\lfloor \frac{\log_{10}\left(1 - \left(\frac{\text{endfreq} - \text{startfreq}}{\text{startbw}}\right) \cdot (1 - \text{geofac})\right)}{\log_{10}(\text{geofac})} \right\rfloor + 1 = n. \quad (2)$$

If geofac=1 applies, the frequency group width remains constant, whereas the frequency group width becomes smaller for geofac<1, and grows for geofac>1. On the basis of empiric experiments, geofac~1.01 has proven appropriate as a value for the growth factor. The frequencies of the NRT nodes node (i) then are exactly at the center of neighboring frequencies of the NRT raster:

$$\text{node}(i) = \frac{\text{freq}(i) + \text{freq}(i+1)}{2}, i = 1, \ldots, n-1 \quad (3)$$

node(i) now represents all frequency lines f for which freq(i) ≤f<freq(i+1) applies.

In many cases (reception) spectra within which the frequency of the first FFT line does not coincide with a frequency of the NRT raster are to be measured. As a result, areas of the reception spectrum at the end or at the beginning are not represented adequately by NRT nodes. However, one goal is that the NRT nodes are adapted optimally to the momentary reception spectrum. This is possible by shifting the NRT raster locally as little as possible up or down in frequency, so that the closest NRT raster frequency coincides with the frequency of the first FFT line (starting frequency) in the spectrum. So as to be able to also represent the end of the spectrum (end frequency) well by an NRT node, the globally adjusted growth factor (geofac) can be slightly modified locally. Optionally, the start frequency group width may also be varied in the corresponding (reception) spectrum. For example, if the last NRT raster frequency (last node frequency) within the reception spectrum is closer to the last FFT line of the reception spectrum, the growth factor is increased (expanded) slightly. However, if the subsequent NRT raster frequency outside the reception spectrum is closer to the frequency of the last FFT line, the growth factor is decreased (shrunk) slightly. So as to determine the modified growth factor, for example, the Newton method can be utilized. Here, one sets:

$$f(\text{geofac}_n) = \text{psdStartbw} \cdot \frac{1 - \text{geofac}_n^k}{1 - \text{geofac}_n} + \text{psdStartfreq} - \text{psdEndfreq} \quad (4)$$

The first derivative of f is:

$$f'(\text{geofac}_n) = \\ -\text{psdStartbw} \cdot \frac{k \cdot \text{geofac}_n^{k-1}}{1 - \text{geofac}_n} + \text{psdStartbw} \cdot \frac{1 - \text{geofac}_n^k}{(1 - \text{geofac}_n)^2} \quad (5)$$

The Newton method may be utilized for iterative determination of the zero points of f, with the iteration series for geofac being given by:

$$\text{geofac}_{n+1} = \text{geofac}_n - \frac{f(\text{geofac}_n)}{f'(\text{geofac}_n)} \quad (6)$$

and an approximation for the locally modified growth factor is obtained on the basis of n=0,1,2, . . . (here, n only designates the iteration step and not the number of frequencies like in Eq. (1)). Here, $\text{geofac}_0$ is the given globally adjusted growth factor, as for example utilized in equation 1. The value k is set to the desired number of NRT raster frequencies within the reception spectrum −1. The value psdStartbw represents the first frequency group width within the spectrum. psdStartfreq (start frequency) or psdEndfreq (end frequency) is the frequency of the first or last FFT line in this (reception) spectrum. Since the Newton method has quadratic convergence, for example, seven iterations are enough for sufficient accuracy. Depending on the desired accuracy, however, the number of iteration steps may also vary, for example, sufficient accuracy may already be present after two, three, four, five or also six iterations. Likewise, it is possible that more than seven iterations are used to increase the accuracy further. Thus, for example, eight, nine, ten or more than twelve iterations can be used.

With the locally modified growth factor (geofac) thus determined, the NRT raster for the frequency range of this reception spectrum then is computed again by way of equation 1. Finally, two additional NRT nodes are set on the first and last FFT lines, representing the range of the first FFT line to the first regular NRT node and/or last regular NRT node to last FFT line. Hence, the reception spectra obtain a local NRT raster of their own, which is as close as possible to the global NRT raster, as given by equation 1.

The following remarks deal with suitable computation of the threshold value (node level values) at the NRT nodes.

At first averaging of successive reception level values is performed, and the result of the averaging is used as a new reception level mean value for the determination of the node level values.

The node level values can be determined based on the associated reception level values. For example, a histogram may be formed therefrom. The node level value may, for example, be determined by way of the lower power level limit in the histogram, or alternatively have a certain distance to the lower power level limit.

Furthermore, the means for determining level values may be formed to correct the node level values, so that a difference of neighboring node level values lies within a maximum tolerance width (e.g. within ±10%, ±20% or ±50%). The correction may also be done such that a previously determined node level value is included in the determination of a momentary node level value such that strongly varying level values are dampened.

The means for determining the node level values comprises a leakage integrator so as to achieve damping, for example.

After the node level values are determined, furthermore, interpolation may take place, in order to determine the threshold value course between the node level values at the node frequencies. The interpolation may, for example, include linear interpolation or cubic interpolation or constrained cubic interpolation.

The means for determining the threshold value courses formed to add an offset in the determination of the threshold value course so that the threshold value course has an offset distance to the noise floor.

Using an eliminator 190 may provide the following advantages and/or the method illustrated may be particularly effective in the following features:
  Flexible and automatic adaptation to existing hardware is possible.
  By way of equation 1, it is possible to use an NRT raster adapting well to real conditions. The bandwidths of the emitters tend to increase toward higher frequencies.
  Furthermore, a far-reaching exclusion of statistical signals with as-good-as-possible approximation of the noise floor can be achieved.
  Very good estimation of the noise floor versus the frequency is achieved, with everything looking like an artificial signal being ignored (the curve is rather flat).
  Statistical signals of artificial origin, e.g. spurious signals, are below the curve.
  Low computation complexity is made possible.
  The implementation is simply structured and, hence, well scalable.

Figure 8:
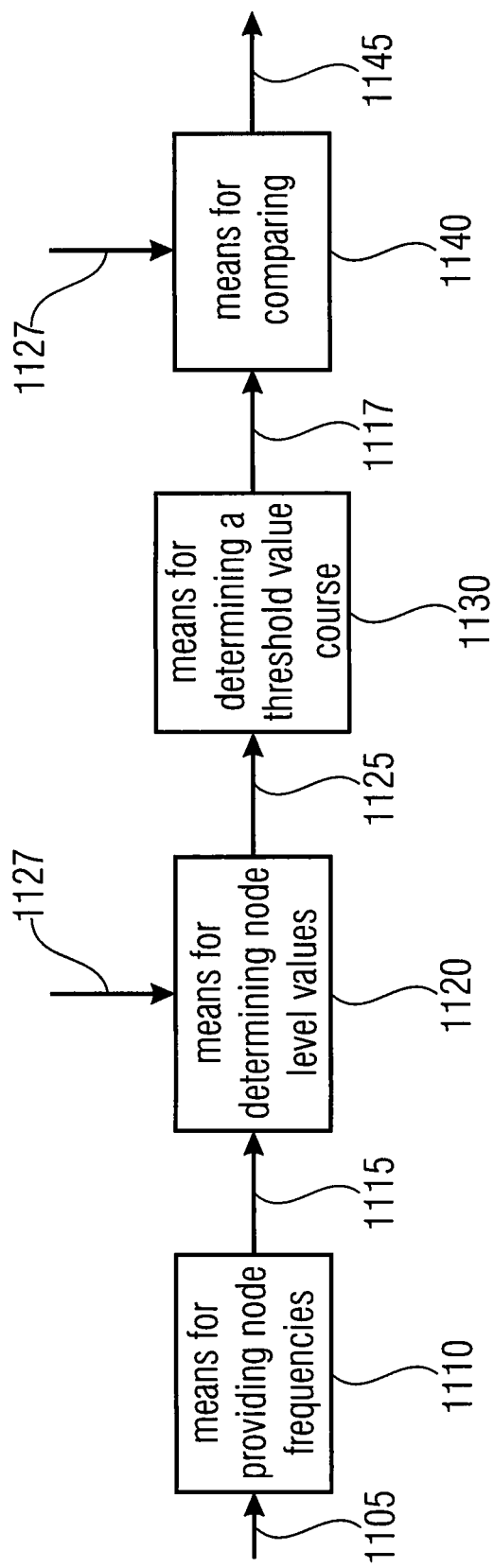
FIG. 8 is a schematic illustration of a module for detecting occupancy.

FIG. 8 shows a schematic illustration of an embodiment of the present invention. The apparatus for frequency-selective occupancy detection of a channel in a frequency band comprises means 1105 for detecting a reception spectrum in the frequency band, means 1110 for providing node frequencies 1115, means 1120 for determining node level values 1125, means 1130 for determining the threshold value course 1117, and means 1140 for comparing.

The apparatus according to the invention serves for frequency-selective occupancy detection of a channel in a frequency band, wherein, at first, a reception spectrum is detected via a means 1105 (e.g. an input) and supplied to means 1110. The means 1110 provides the node frequencies 1115 for a threshold value course 1117 with respect to a noise floor in the frequency band. The means 1120 determines the node level values 1125 and the node frequencies 1115 on the basis of reception level values 1127 of the reception spectrum. The means 1130 determines the threshold value course 1117 in the frequency band on the basis of the node frequencies 1115 provided and on the node level values 1125 at the node frequencies 1115. The means 1140 compares a momentary power of the reception level values 1127 in the channel to a comparative power in the channel as given by the threshold value course 1117, in order to detect (or determine) occupancy or non-occupancy of the channel depending on the comparison. For example, the result may be output via an output 1145. For example, the output may here include a percentage value to which the channel is occupied, so that the channel may be considered occupied to a value of clearly above 50% (e.g. 80% or 90%), for example.

Figure 9:
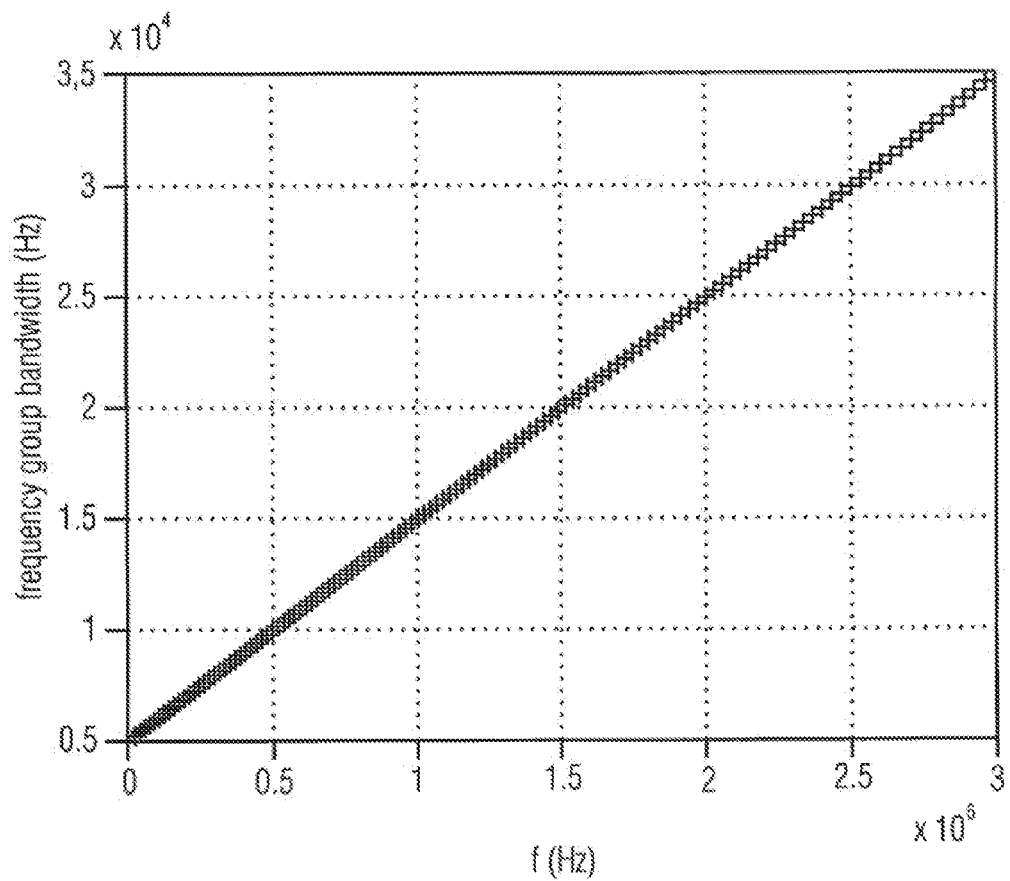
FIG. 9 is an illustration of the increase in frequency group bandwidth with the frequency.

FIG. 9 shows an exemplary dependency of the frequency group bandwidth (measured in Hertz) on the frequency (measured in Hertz). In the example depicted, the ratio of the frequency of the NRT node to the NRT frequency group width thus is illustrated, wherein the following values were taken as an example for the parameters (in equations 1 to 3): geofac=1.01, startbw=5 kHz, startfreq=9 kHz and endfreq=3 MHz. The frequency group bandwidth illustrated results from equations 1 to 3 and increases monotonously with the frequency. This is a result of the geometric series for the growth factor geofac, which is greater than 1. The ratios here are illustrated by crosses, so that a first cross is at the NRT node of (9+5)/2=7 kHz and the first frequency group bandwidth is at 5 kHz.

Figure 10:
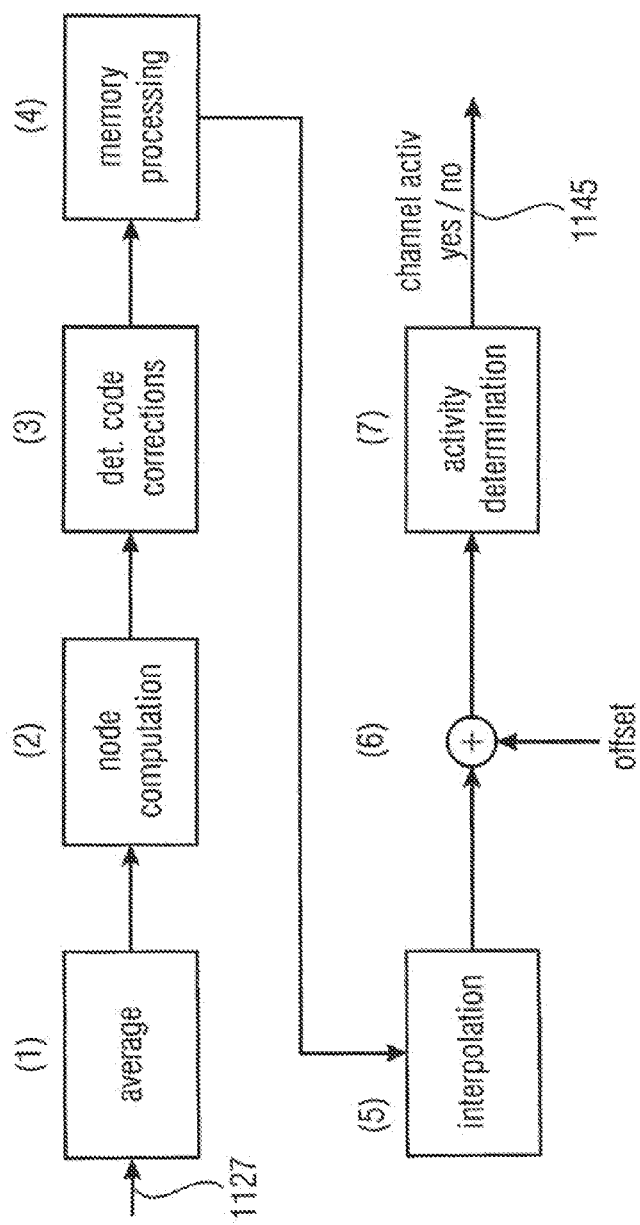
FIG. 10 is a schematic illustration for the computation of the threshold value course.

FIG. 10 shows computation of the NRT as part (b) of the above-mentioned algorithm on the basis of a block circuit diagram. In the exemplary processing order illustrated, the processing steps (1) to (7) are performed per reception spectrum 1127.

Here, the individual steps may, for example, include the following functions:

(1) Averaging:

Here, averaging of successive input spectra (PSD), which may include the reception level values 1127, may be performed. The averaging may, for example, be done by the formation of an arithmetic mean value of successive spectra or on the basis of a memory averaging, as may be done by a so-called leaky integrator, for example. By way of the averaging, it is possible to variably adjust the width of the noise floor, <1 dB, for example.

(2) Node Computation:

Within this processing block, in which the node level values 1125 are determined, for example, a histogram of reception level values 1127 may be formed at a resolution of −235 dBm to 20 dBm in steps of 1 dB, for example. Reception level values 1127 below −235 dBm may here, for example, be sorted in a first bucket (or basket) of the histogram, and values above 20 dBm may, for example, be sorted into a last bucket of the histogram. Depending on the freely adjustable parameter (noisefac), it may now be chosen how many buckets are discarded, to determine the power level of these NRT nodes (node level values 1125). This processing step takes place in the means 1120 for determining node level values 1125.

The number of discarded buckets may, for example, be determined by way of the following formula:

$$numBucketsSkip = \left\lfloor \frac{noisefac}{100} \cdot numBucketsNotZero \right\rfloor \quad (7)$$

Further details on this processing step will be described in greater detail on the basis of FIG. 11.

(3) Determining Code Corrections:

Due to diverse signal properties it is possible that node level values 1125 of the NRT nodes that deviate from other existing node level values 1125 are determined in the processing block (2). These extreme values may be readjusted on the basis of the node correction (nodes correction). For example, it would be possible to allow only a maximum deviation from the proceeding value. This node correction is an optional processing step or an optional processing stage.

(4) Memory Processing

In this optional processing stage, temporally proceeding node level values may be included in the computation of the momentary node level values (memory). One way of realizing this is given by a so-called leaky integrator, for example. There are various forms of the leaky integrator, of which two are to be illustrated exemplarily here:

(A) Simple leaky integrator: The leaky integrator generates a kind of sliding average.

$$y(i) = \frac{x(i) + y(i-1) \cdot \omega}{\omega + 1}, i = 1, \ldots, n \quad (8)$$

Wherein x(i) is the momentary level value and y(i) the averaged level value in the respective processing stage (iteration), which is numbered "i". Here, ω is the weighting factor, and y(i−1)=x(1) is set for i=1 in the implementation.

(B) Advanced leaky integrator: This approach allows for different saturation and decay behavior. If x(i)>y(i−1), saturation is brought about by $$y(i) = \alpha \cdot y(i-1) + (1-\alpha) \cdot x(i) \quad (9)$$

It may be configured by way of a time constant α. In the implementation, y(i−1)=x(1) is set for i=1. If x(i)≤y(i−1), decaying behavior is produced by way of $$y(i) = \beta \cdot y(i-1) + (1-\beta) \cdot x(i) \quad (10)$$

The decay behavior may be configured by way of a time constant β.

(5) Interpolation:

The level values 1125 determined up to this point at the NRT nodes may now be interpolated on the basis of the frequencies of the FFT lines of the momentary spectrum (reception level values 1127). In embodiments of the NRT algorithm, three interpolation methods are possible: The linear, the cubic (so-called cubic spline) and the constrained cubic interpolation (so-called constrained cubic spline). Values to be interpolated and lying outside the NRT nodes either are extrapolated from the two neighboring level values 1125 and the NRT nodes in linear manner or the closest NRT node power level value is continued (slope 0). Further details will be described on the basis of FIGS. 12*a* and 12*b*.

(6) Adding an Offset (Offset Addition):

For fine-tuning, an offset in x dB may be added to the NRT computed so far, forming the threshold value course 1117. This offset shifts the threshold value course 1117 by the magnitude of the offset.

(7) Activity Determination:

The activity detection includes an estimation as to whether the channel can be classified as occupied/unoccupied. In this step, for example, the momentary power $P_{PSD}$ in the channel to be observed may be computed and then compared with a comparative power $P_{NRT}$ in the channel as given by the threshold value course 1117. Both powers may, for example, be averaged quadratically (RMS=root mean square) and computed as follows:

$$\hat{P}_{PSD_{RMS}} = \sqrt{\frac{1}{n}\sum_{i=k}^{n+k-1}\left(10^{\frac{x(i)_{PSD}}{10}}\cdot 0.001\right)^2} = \sqrt{\frac{1}{10^6 n}\sum_{i=k}^{n+k-1}\left(10^{\frac{x(i)_{PSD}}{5}}\right)}; \quad (10)$$

$$\hat{P}_{NRT_{RMS}} = \sqrt{\frac{1}{n}\sum_{i=k}^{n+k-1}\left(10^{\frac{x(i)_{Thr}}{10}}\cdot 0.001\right)^2} = \sqrt{\frac{1}{10^6 n}\sum_{i=k}^{n+k-1}\left(10^{\frac{x(i)_{Thr}}{5}}\right)}. \quad (11)$$

Here, k is the first spectral value to be taken into account in this channel (reception level value 1127). Here, n is the overall number of the spectral values to be taken into account in this channel.

If:

$$\hat{P}_{PSD_{RMS}} > \hat{P}_{NRT_{RMS}}, \quad (12)$$

then the channel may, for example, be classified as active (occupied), otherwise not. Instead of the RMS, simple summation of powers may take place, so that the quantities $$\hat{S}_{PSD_{LinSum}} = \sum_{i=k}^{n+k-1}\left(10^{\frac{x(i)_{PSD}}{10}}\cdot 0.001\right), \quad (13)$$

$$\hat{S}_{NRT_{LinSum}} = \sum_{i=k}^{n+k-1}\left(10^{\frac{x(i)_{Thr}}{10}}\cdot 0.001\right) \quad (14)$$

are compared, and if $\hat{S}_{PSD_{LinSum}} > \hat{S}_{NRT_{LinSum}}$, the channel again is classified (detected) as occupied.

Upon completion of the activity determination, the result as to whether the channel is occupied or not may be output via the output 1145. Optionally, the output 1145 may comprise a display.

Figure 11:
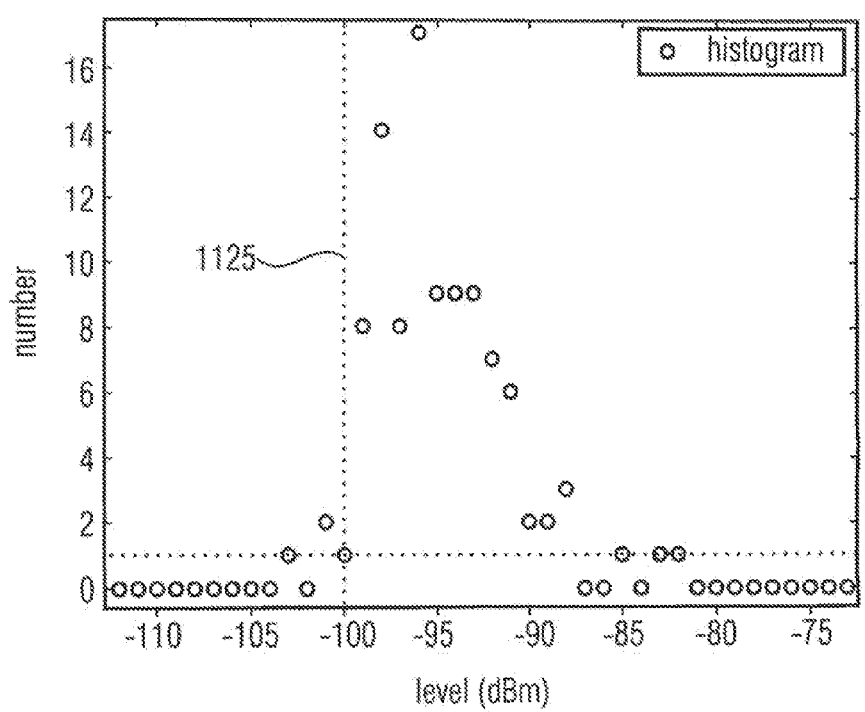
FIG. 11 is a histogram illustration for determining a node level value.

FIG. 11 gives an exemplary illustration of the determination of a level value 1125 at one of the node frequencies 1115. This illustration refers to equation 7, in which noisefac=12 was used, i.e. 12% of non-empty buckets are discarded from small values, to determine the node level value 1125 of this NRT node. In the case shown in FIG. 11, two buckets of a total of 18 non-empty buckets were discarded, so that a power level of −100 dBm was obtained as the level value 1125 of the node frequency 1115. In detail, FIG. 11 shows a probability distribution of the level values, wherein the first non-zero level value is at −103 dBm, and the second non-zero level value is at −101 dBm. These two first level values (as viewed from lower level values) are discarded due to the assumed noisefac in the given example (12% of 18=2). The next non-zero level value lies at −100 dBm, with the level values of −103 dBm and −100 dBm each occurring once in the histogram, and the level value of −101 dBm occurring twice in the histogram. Subsequently, the fourth level value at −99 dBm occurs 8 times altogether, the fifth level value at −98 dBm 14 times, the sixth level value at −97 dBm 8 times, and the seventh level value at −96 dBm 17 times altogether. The histogram continues up to the last non-zero level value, which is at −82 dBm and occurs once in the histogram. No non-zero level values were measured above the level value of −82 dBm and below the level value of −106 dBm.

In further embodiments, the noisefac may be varied so that not only two level values are discarded, but more or even less level values are discarded, to determine the node level value 1125 for the node frequency 1115.

Figures 12A, 12B:
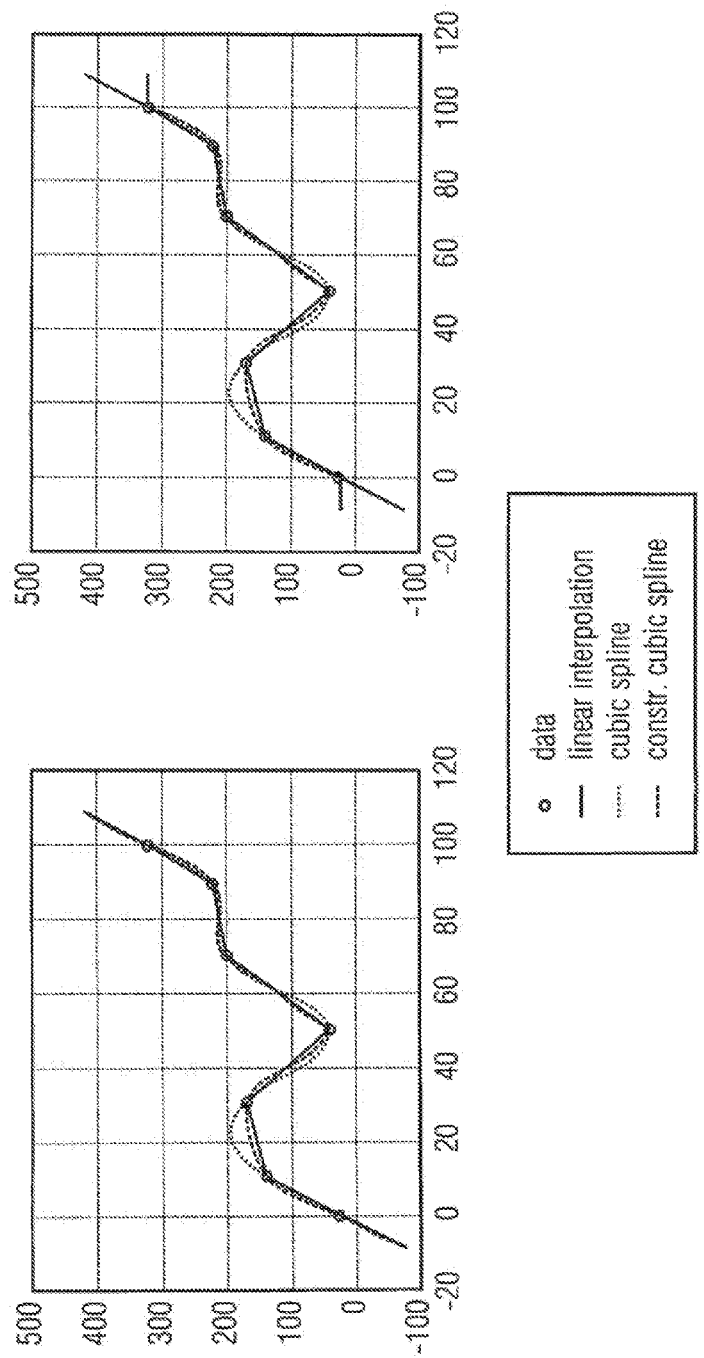
FIGS. 12a,b show a comparison of possible interpolation types.

In FIGS. 12*a,b* the various interpolation methods that can be performed in processing step (5) of FIG. 10 are compared. Altogether, three interpolation methods are compared with each other in FIGS. 12*a,b*: with the closely dotted line representing a linear interpolation of the data (characterized by circles), a thinly dotted line representing the cubic interpolation, and a solid line representing the constrained cubic interpolation. All interpolations pass the data points illustrated as circles.

In the linear interpolation, the data points are connected to each other by straight lines. In the cubic and constrained cubic interpolation, the portions between two neighboring data points each are represented by a cubic polynomial each. In the cubic interpolation, the cubic polynomials are adapted such that both the first and the second derivative of the cubic polynomials behave steadily at the data points, whereas in the constrained cubic interpolation the polynomial itself and the first derivatives, but not the second derivatives behave steadily. Instead, in the constrained cubic interpolation, as an additional boundary condition, it has been assumed that the value of the first derivative has a predetermined value at the data points. This predetermined value may, for example, be chosen so that the tangent at the data points lies as centrally as possible between the straight lines of the linear interpolation, so that the intermediate regions between the data points lie as closely as possible to the linear interpolation.

The difference between FIGS. 12*a* and 12*b* lies in the fact of how the interpolation is continued beyond the first and last data points, i.e. for values <0 or for values >100. In FIG. 12*a*, linear extrapolation takes place, whereas a constant continuation of the graphs (with zero slope) takes place in FIG. 12*b*. The curves illustrated thus designate a threshold value course between the nodes.

It is a disadvantage of the cubic interpolation method (cubic spline) that, independently of the location of the nodes, strong "overshoots" may occur (for example, see at the value x=20 in FIG. 12*a*). The linear interpolation does not have this problem, but has the disadvantage of producing vertexes at the nodes (non-steady first derivative). The constrained cubic interpolation method attempts to deal with both problems. On the one hand, the "overshoots" are eliminated as far as possible, but the vertexes are eased, on the other hand.

Figure 13:
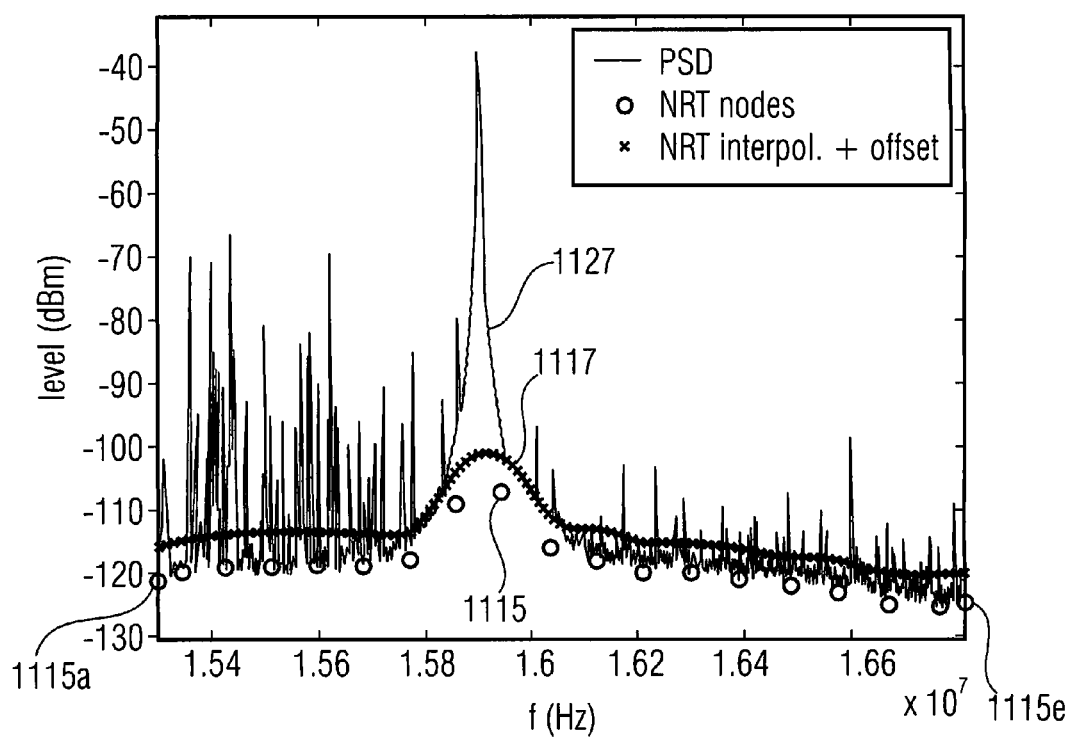
FIG. 13 shows a computed threshold value course in the short-wave region.
Figure 14:
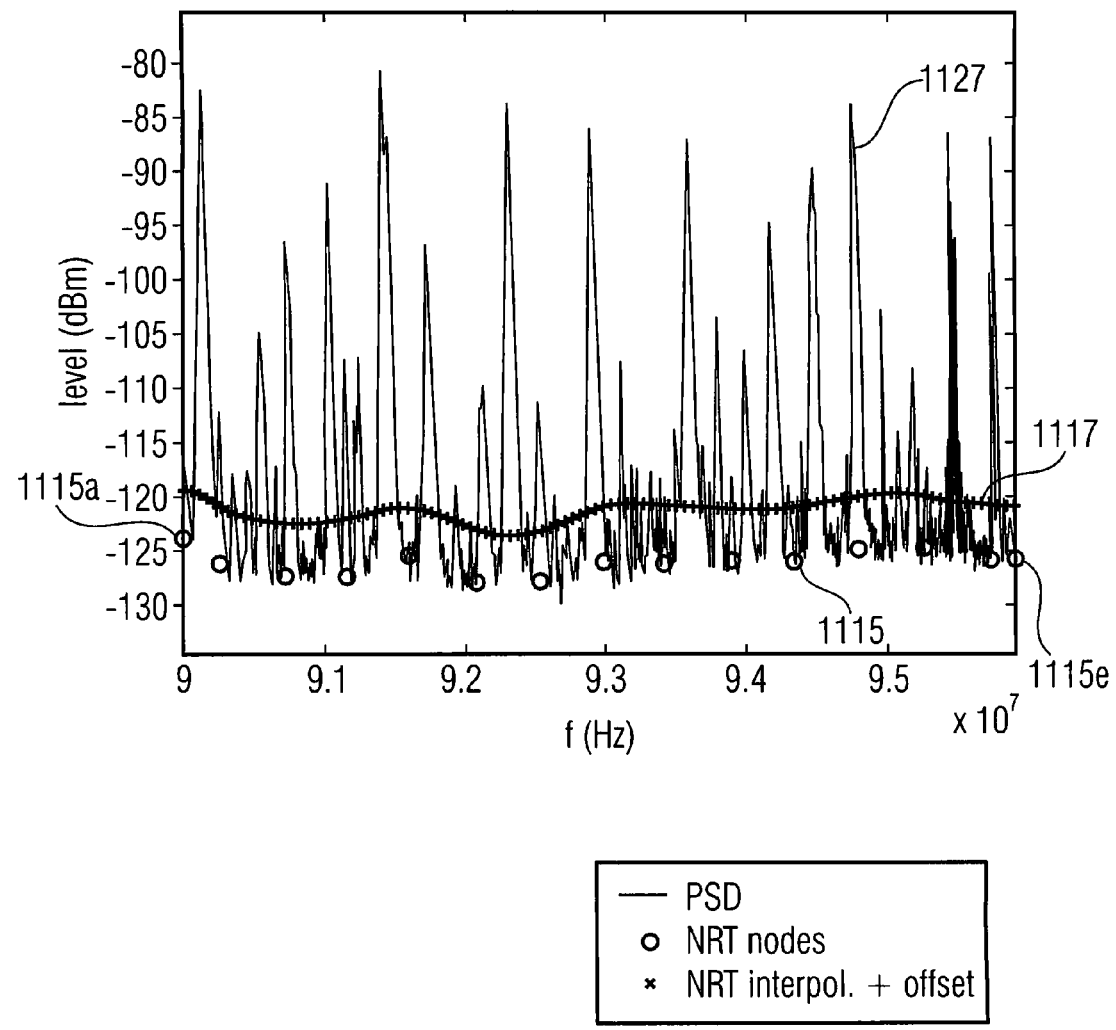
FIG. 14 shows a computed threshold value course in the USW broadcast region.

FIGS. 13 and 14 show the functioning of the NRT algorithm according to the invention on the basis of real signals in the short-wave or USW broadcasting range.

FIG. 13 shows a computed NRT (threshold value course 1117) in the short-wave region. Here, the reception level values 1127 for which the NRT nodes or node level values 1125 were computed are shown, in order to finally determine therefrom the threshold value course 1117 (definitely computed NRT), which takes into account both an interpolation and the offset. The offset causes a shift of the threshold value course 1117 toward greater level values (above the node level values 1125). In FIG. 13, the following values were assumed as examples, center frequency: 16.0475 MHz, offset 5 dB, local geofac: 1.0068.

FIG. 14 shows an NRT computed in analog manner for the ultrashort-wave broadcast region, wherein the following values were assumed as examples in FIG. 14: center frequency=92.975 MHz, offset=5 dB, local geofac=1.0022. In FIG. 14, there also is shown a reception level 1127 for which the node level values 1127 were computed. Then, the threshold value course 1117 was computed by way of interpolation and by adding the offset.

It can be seen both in FIG. 13 and in FIG. 14 that the first node frequency 1115a and the last node frequency 1115e are at the beginning and at the end of the frequency band, respectively, i.e. the first node frequency 1115a is located at about 15.3 MHz and the last node frequency 1115e at about 16.8 MHz in FIG. 13. In between, a total of 17 node frequencies 1125 is located. In similar fashion, in FIG. 14, the first node frequency 1115a is located at the beginning of the spectrum at about 90 MHz, and the last node frequency 1115e is located at the end point of the examined frequency band at about 96 MHz. In FIG. 14, there are a total of 13 further node frequencies 1115 between these two end points.

In both Figures, it can be seen clearly how the threshold value course 1117 (NRT) adapts to the noise floor, which is a substantial advantage of embodiments of the present invention.

In FIGS. 15a, b, there is shown an exemplary configuration, as may be used within a computer program for spectral occupancy measurement, for example. The computer program may thus control a measurement system for spectral occupancy measurement.

As shown in FIG. 15a, for example, the frequency range from 88.1 MHz to 107.5 MHz is measured at a channel bandwidth of 50 kHz. Additionally, the frequency of 100 MHz was measured at a channel width of 100 kHz, wherein the frequency range between 90 MHz and 91 MHz was excluded from the measurement. In this measurement, the offset of 10 dB was set, and the overall measurement time was 2 hours, with a statistic having been computed over intervals of 2 minutes each.

FIG. 15b shows the result of the measurement after 3 minutes and 44 seconds for the 369 channels to be measured, for which a statistic each was computed. For example, it could be seen that the frequency of 89.7 MHz has a bandwidth of 50 kHz with a relative accuracy of ±10.4% is occupied 86.6%. Over the course of the overall measurement time (2 hours), the relative accuracy across this channel decreases, so that the measurement result more and more approaches the actual channel occupancy. The relative accuracy may here, for example, be determined by common statistical methods, wherein FIG. 15b, as mentioned, only shows a first intermediate result of the measurement system for spectral occupancy measurement.

In further practical implementations of the NRT algorithm according to the invention, the parameters may, for example, be chosen as follows: startbw=8 kHz, startfreq=9 kHz, endfreq=3 GHz, geofac=1.01 averaging=4 . . . 32, noisefac=5%, offset=5 dB, and an FFT length of 4096. However, these are only exemplary values, which may be changed in further embodiments.

The working principle may, hence, be summarized as follows. They include a method for frequency-selective occupancy measurement on the basis of a threshold value determined from the noise floor, for example, characterized in that several NRT nodes or node frequencies 1115 are used for the computation of the threshold value (NRT). Furthermore, the node frequencies 1115 (the frequencies of the NRT nodes underlying the NRT) may be adapted flexibly to real conditions on the basis of various parameters. For example, the adaptation may take place with respect to a minimization of the error rate. Moreover, the node frequencies 1115 may be adapted flexibly to real conditions on the basis of a geometric series. In embodiments, it is also possible to interpolate the determined power levels (level values 1125 at the node frequencies 1115) of the NRT nodes. The level values 1125 at the node frequencies 1115 here may, for example, be interpolated on the basis of a cubic spline or constrained cubic spline interpolation.

In further embodiments, the NRT raster may be adapted to the momentary reception spectrum (reception level values 1127). The adaptation to the momentary reception spectrum may, for example, be realized by way of a frequency shift and adaptation of the growth factor. The frequency shift and the adaptation of the NRT raster to the momentary reception spectrum, may, for example, be realized by way of a locally modified factor of the geometric series.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The inventive encoded audio signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus, implemented in hardware, for providing a reduced representation in the frequency domain based on a time-domain RF signal, the apparatus comprising:
a time-frequency converter adapted to transform the time-domain RF signal to acquire a frequency-domain representation based on the time-domain signal, wherein the time-frequency converter is adapted to weight the frequency-domain representation with a weighting function, wherein the weighting function comprises at least one frequency region centered around a center frequency and comprising a frequency width, wherein the weighting function comprises a higher, constant value inside the at least one frequency region compared to at least one value outside the frequency region;
an entropy encoder adapted to acquire the reduced representation by entropy encoding a signal representing the frequency-domain representation or derived from the frequency-domain representation; and
an eliminator adapted to remove at least one portion of the weighted frequency-domain representation, wherein a signal property of the portion of the weighted frequency-domain representation fulfills a predetermined condition,
wherein the eliminator is adapted to determine as to whether the signal portion fulfills the predetermined condition based on a) a threshold value adaptively determined from a noise floor of a momentary reception spectrum or b) based on a frequency dependent threshold value course and flexibly adapting to a respective noise floor.

2. The apparatus according to claim 1, further comprising a control circuit adapted to alter the weighting function on user request, a control signal or in case an amount of data of the reduced representation is larger than a predetermined value.

3. The apparatus according to claim 1, wherein the eliminator is adapted to set the at least one removed portion of the weighted frequency-domain representation to a predetermined value or to at least one value from a predetermined range of values.

4. The apparatus according to claim 1, wherein the eliminator is adapted to exclude at least one of the at least one removed portion of the weighted frequency-domain representation.

5. The apparatus according to claim 1, further comprising a control circuit adapted to influence the entropy encoder such that a length of an alphabet used for entropy encoding is reduced.

6. The apparatus according to claim 1, further comprising a splitter adapted to split the weighted frequency-domain representation into a plurality of words, the plurality of words together forming the weighted frequency-domain representation, wherein a length of each of the words of the plurality of words is shorter than the length of the weighted frequency-domain representation, and wherein the entropy encoder is adapted to acquire the reduced representation based on the plurality of words.

7. The apparatus according to claim 1, further comprising at least one of a truncator adapted to truncate the weighted frequency-domain representation such that a resolution of the weighted frequency-domain representation is reduced and a splitter.

8. The apparatus according to claim 7, further comprising a control circuit to activate or to influence at least one of the splitter and the truncator.

9. An apparatus, implemented in hardware, for providing a reduced representation in the frequency domain based on a time-domain RF signal,
the apparatus comprising:
a time-frequency converter adapted to transform the time-domain RF signal to acquire a frequency-domain representation based on the time-domain signal;
an entropy encoder adapted to acquire the reduced representation by entropy encoding a signal representing the frequency-domain representation or derived from the frequency-domain representation; and
an eliminator adapted to remove at least one portion of the frequency-domain representation, wherein a signal property of the portion of the frequency-domain representation fulfills a predetermined condition,
wherein the eliminator is adapted to determine as to whether the signal portion fulfills the predetermined condition based on a) a threshold value adaptively determined from a noise floor of a momentary reception spectrum or b) based on a frequency dependent threshold value course and flexibly adapting to a respective noise floor, and
further comprising an evaluator adapted to compare an amount of data of the reduced representation acquired by the entropy encoder and of the signal representing the frequency-domain representation or derived from the frequency-domain representation, based on which the entropy encoder acquired the reduced representation and to provide that signal or the reduced representation, depending on which of both comprises a lower amount of data.

10. A method for providing a reduced representation in a frequency domain based on a time-domain RF signal,
the method comprising:
time-frequency converting the time-domain RF signal to acquire a frequency-domain representation based on the time-domain RF signal;
weighting the frequency-domain representation with a weighting function, wherein the weighting function comprises at least one frequency region centered around a center frequency and comprising a frequency width, wherein the weighting function comprises a higher, constant value inside the at least one frequency region compared to at least one value outside the frequency region;
removing at least one portion of the weighted frequency-domain representation, wherein a signal property of the portion of the weighted frequency-domain representation fulfills a predetermined condition; and
acquiring the reduced representation by entropy encoding a signal representing the frequency-domain representation or derived from the frequency-domain representation,
wherein determination as to whether the signal portion fulfills the predetermined condition is done based on a) a threshold value adaptively determined from a noise floor of a momentary reception spectrum or b) based on a frequency dependent threshold value course and flexibly adapting to a respective noise floor.

11. A non-transitory computer readable medium comprising code stored thereon, which when executed by a computer causes the computer to perform steps for providing a reduced representation in a frequency domain based on a time-domain RF signal,
the steps comprising:
time-frequency converting the time-domain RF signal to acquire a frequency-domain representation based on the time-domain RF signal;
weighting the frequency-domain representation with a weighting function, wherein the weighting function comprises at least one frequency region centered around a center frequency and comprising a frequency width, wherein the weighting function comprises a higher, constant value inside the at least one frequency region compared to at least one value outside the frequency region;
removing at least one portion of the weighted frequency-domain representation, wherein a signal property of the portion of the weighted frequency-domain representation fulfills a predetermined condition; and
acquiring the reduced representation by entropy encoding a signal representing the frequency-domain representation or derived from the frequency-domain representation,
wherein determination as to whether the signal portion fulfills the predetermined condition is done based on a) a threshold value adaptively determined from a noise floor of a momentary reception spectrum or b) based on a frequency dependent threshold value course and flexibly adapting to a respective noise floor.

* * * * *